United States Patent
Fukui et al.

(10) Patent No.: US 11,282,709 B2
(45) Date of Patent: Mar. 22, 2022

(54) CHEMICAL AGENT FOR FORMING WATER REPELLENT PROTECTIVE FILM AND SURFACE TREATMENT METHOD FOR WAFERS

(71) Applicant: CENTRAL GLASS COMPANY, LIMITED, Ube (JP)

(72) Inventors: Yuki Fukui, Ube (JP); Yoshiharu Terui, Ube (JP); Shuhei Yamada, Ube (JP); Yuzo Okumura, Ube (JP); Soichi Kumon, Matsusaka (JP); Saori Shiota, Ube (JP); Katsuya Kondo, Auderghem (BE)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 0 days.

(21) Appl. No.: 16/957,331

(22) PCT Filed: Dec. 26, 2018

(86) PCT No.: PCT/JP2018/047754
§ 371 (c)(1),
(2) Date: Jun. 23, 2020

(87) PCT Pub. No.: WO2019/138870
PCT Pub. Date: Jul. 18, 2019

(65) Prior Publication Data
US 2020/0350176 A1    Nov. 5, 2020

(30) Foreign Application Priority Data

Jan. 15, 2018  (JP) .............................. JP2018-003977
Dec. 11, 2018  (JP) .............................. JP2018-231703

(51) Int. Cl.
  *H01L 21/306*    (2006.01)
  *C07F 7/10*      (2006.01)
  *H01L 21/02*     (2006.01)

(52) U.S. Cl.
  CPC .............. *H01L 21/306* (2013.01); *C07F 7/10* (2013.01); *H01L 21/02057* (2013.01)

(58) Field of Classification Search
  CPC .... H01L 21/306; H01L 21/02057; C07F 7/10; C09K 3/18; C09D 5/1612; C09D 7/20; C09D 7/63
  (Continued)

(56) References Cited

U.S. PATENT DOCUMENTS

| 2012/0211025 A1 | 8/2012 | Kumon et al. |
| 2013/0056023 A1* | 3/2013 | Kumon ................ C09D 183/08 134/1.2 |
| 2016/0148802 A1* | 5/2016 | Kumon .................... C09K 3/18 134/1 |

FOREIGN PATENT DOCUMENTS

| JP | 2012-015335 | 1/2012 |
| JP | 2012-033873 | 2/2012 |

(Continued)

OTHER PUBLICATIONS

Translation of JP JP5821844B2 (Year: 2015).*

(Continued)

*Primary Examiner* — Duy Vu N Deo
(74) *Attorney, Agent, or Firm* — Hamre, Schumann, Mueller & Larson, P.C.

(57) ABSTRACT

According to the present disclosure, there is provided a water-repellent protective film-forming liquid chemical capable of achieving an improved water repellency imparting effect. The water-repellent protective film-forming liquid chemical according to the present disclosure contains the following compositions: (I) an aminosilane composition of (Continued)

Prepare Solution (Water-Repellent Protective Film-Forming Liquid Chemical) by Mixing At Least Components (I), (II) and (III)

↓

Form Water-Repellent Protective Film on Wafer Surface by Replacing Cleaning Liquid or Rinse Liquid etc. Retained on Wafer Surface with Liquid Chemical and Retaining Liquid Chemical on Wafer Surface

↓

Remove Liquid from Wafer Surface by Drying the following general formula [1]; (II) a silicon compound of the following general formula [2]; and (III) an aprotic solvent, wherein the amount of the component (I) contained is 0.02 to 0.5 mass % based on the total amount of the components (I) to (III).

$$(R^1)_a Si(H)_b (NH_2)_{4-a-b} \quad [1]$$

$$(R^2)_c Si(H)_d X_{4-c-d} \quad [2]$$

24 Claims, 5 Drawing Sheets

(58) Field of Classification Search
USPC .................. 438/694, 745–754; 134/1–1.3
See application file for complete search history.

(56) References Cited

FOREIGN PATENT DOCUMENTS

| | | |
|---|---|---|
| JP | 2013-118347 | 6/2013 |
| JP | 5821844 | 11/2015 |
| JP | 2016-036038 | 3/2016 |
| SG | 185632 | 12/2012 |

OTHER PUBLICATIONS

Office Action dated Feb. 17, 2019 for Taiwanese patent application No. 108101088, 6 pages.
International Search Report of PCT/JP2018/047754, dated Feb. 12, 2019, 5 pages including English translation.

\* cited by examiner

* The content amount of the aminosilane compound is based on the total amount of the components (I) to (III).

\* The content amount of the aminosilane compound is based on the total amount of the components (I) to (III).

CHEMICAL AGENT FOR FORMING WATER REPELLENT PROTECTIVE FILM AND SURFACE TREATMENT METHOD FOR WAFERS

FIELD OF THE INVENTION

The present disclosure relates to a water-repellent protective film-forming liquid chemical for forming a water-repellent protective film on a recess portion of a fine uneven pattern on a surface of a substrate (wafer) and to a surface treatment method for a wafer.

BACKGROUND ART

It is required that semiconductor devices for networks and digital home appliances have higher performance, higher functionality and lower power consumption. In response to this requirement, the fine processing of circuit patterns has been pursued. However, a problem has been revealed as the aspect ratio of patterns becomes high with the miniaturization of semiconductor devices. More specifically, there occurs a phenomenon in which the pattern collapses upon the passage of a gas-liquid interface through the pattern (hereinafter also referred to as "pattern collapse") after cleaning or rinse operation. The occurrence of such pattern collapse, which results in a significant deterioration of device yield, has become a big problem.

The pattern collapse occurs at the time when a cleaning liquid or rinse liquid gets removed from the wafer surface by drying. It is said that the cause of the pattern collapse is variations in capillary force on the pattern due to differences in residual liquid height between high- and low-aspect-ratio parts of the pattern. It is hence expected that, when the capillary force on the pattern is decreased by replacing the cleaning liquid or rinse liquid with a water-repellent protective film-forming liquid chemical and thereby forming a water-repellent protective film on a surface of the pattern, the variations in capillary force on the pattern due to differences in residual liquid height can be reduced so as to resolve the pattern collapse problem.

The present applicant has disclosed in Patent Document 1 a liquid chemical for, in a process of cleaning a wafer having on a surface thereof a fine uneven pattern at least a part of which contains a silicon element, forming a water-repellent protective film on at least a surface of a recess portion of the uneven pattern, characterized in that: the liquid chemical contains an acidic silicon compound of the following general formula and an acid A; the acid A is at least one selected from the group consisting of trimethylsilyl trifluoroacetate, trimethylsilyl trifluoromethanesulfonate, dimethylsilyl trifluoroacetate, dimethylsilyl trifluoromethanesulfonate, butyldimethylsilyl trifluoroacetate, butyldimethylsilyl trifluoromethanesulfonate, hexyldimethylsilyl trifluoroacetate, hexyldimethylsilyl trifluoromethanesulfonate, octyldimethylsilyl trifluoroacetate, octyldimethylsilyl trifluoromethanesulfonate, decyldimethylsilyl trifluoroacetate and decyldimethylsilyl trifluoromethanesulfonate; and the total content of water in starting raw materials of the liquid chemical is 100 mass ppm or less based on the total amount of the starting raw materials, and a method of cleaning a wafer with the use of such a liquid chemical.

$$R_aSi(H)_bX_{4-a-b}$$

In the above general formula, R is each independently at least one group selected from a monovalent organic group having a hydrocarbon structure of 1 to 18 carbon atoms and a monovalent organic group having a fluoroalkyl chain of 1 to 8 carbon atoms; X is each independently a monovalent organic group of which element to be bonded to Si element is nitrogen; a is an integer of 1 to 3; b is an integer of 0 to 2; and the sum of a and b is 1 to 3.

PRIOR ART DOCUMENTS

Patent Documents

Patent Document 1: Japanese Patent No. 5821844

SUMMARY OF THE INVENTION

Problems to be Solved by the Invention

In the field of semiconductor device manufacturing, there have been developed water-repellent protective film-forming liquid chemicals as substrate (wafer) cleaning techniques for improving the production yield of devices with particularly fine and high-aspect-ratio circuit patterns. The protective film-forming liquid chemical of Patent Document 1 certainly exerts a good water repellency imparting effect, and achieves good storage stability by controlling the total content of water in the starting raw materials of the liquid chemical to be 100 mass ppm or less based on the total amount of the starting raw materials. With the recent increasing trend for high integration and miniaturization of semiconductor devices, however, the formation of finer and higher-aspect-ratio wafer patterns has been proceeding. Under such a circumstance, it is desired that the water-repellent protective film-forming liquid chemical for pattern collapse reduction shows a further improved water repellency imparting effect.

Means for Solving the Problems

One aspect of the present disclosure is a water-repellent protective film-forming liquid chemical (hereinafter also simply referred to as "protective film-forming liquid chemical" or "liquid chemical"), containing the following components:

(I) an aminosilane compound of the following general formula [1];
(II) a silicon compound of the following general formula [2]; and
(III) an aprotic solvent,
wherein the amount of the component (I) contained in the liquid chemical is 0.02 to 0.5 mass % based on the total amount of the components (I) to (III).

$$(R^1)_aSi(H)_b(NH_2)_{4-a-b} \quad [1]$$

In the general formula [1], $R^1$ is each independently a monovalent organic group having a monovalent hydrocarbon structure of 1 to 18 carbon atoms in which a part or all of hydrogen atoms may be substituted with a fluorine atom; a is an integer of 1 to 3; b is an integer of 0 to 2; and the sum of a and b is 1 to 3.

$$(R^2)_cSi(H)_dX_{4-c-d} \quad [2]$$

In the general formula [2], $R^2$ is each independently a monovalent organic group having a monovalent hydrocarbon structure of 1 to 18 carbon atoms in which a part or all of hydrogen atoms may be substituted with a fluorine atom; X is at least one group selected from the group consisting of a halogen atom, a —OC(=O)$R^3$ group, a —OS(=O)$_2$—$R^3$ group, a —N(S(=O)$_2$—$R^3$)$_2$ group and a —C(S(=O)$_2$—

$R^3)_3$ group where $R^3$ is a monovalent perfluoroalkyl group of 1 to 6 carbon atoms; c is an integer of 1 to 3; d is an integer of 0 to 2; and the sum of c and d is 1 to 3.

The component (I) is preferably a compound of the following general formula [3] for uniform protective film formation.

$$(R^1)_e Si(H)_f NH_2 \quad [3]$$

In the general formula [3], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

It is preferable that the liquid chemical further contains the following component: (IV) a silazane compound of the following general formula [4] for ease of liquid chemical preparation.

$$[(R^1)_e Si(H)_f]_2 NH \quad [4]$$

In the general formula [4], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

In terms of improvement in water repellency imparting effect, the amount of the component (II) contained in the liquid chemical is preferably 0.05 mass % or more based on the total amount of the components (I) to (III). In terms of cost, the amount of the component (II) contained in the liquid chemical is preferably 20 mass % or less based on the total amount of the components (I) to (III).

Further, the component (II) is preferably at least one kind of compound selected from the group consisting of those of the following general formula [5] in terms of improvement in water repellency imparting effect.

$$(R^2)_g Si(OC(=O)R^3)_{4-g} \quad [5]$$

In the general formula [5], $R^2$ is each independently a monovalent organic group having a monovalent hydrocarbon structure of 1 to 18 carbon atoms in which a part or all of hydrogen atoms may be substituted with a fluorine atom; $R^3$ is a monovalent perfluoroalkyl group of 1 to 6 carbon atoms; and g is an integer of 1 to 3.

Another aspect of the present disclosure is a surface treatment method for a wafer, including: a water-repellent protective film-forming step of, in a state that at least one kind of liquid selected from the group consisting of a cleaning liquid and a rinse liquid is retained on a surface of the wafer, replacing the liquid with a water-repellent protective film-forming liquid chemical and retaining the water-repellent protective film-forming liquid chemical on the surface of the wafer; and a drying step, wherein the water-repellent protective film-forming liquid chemical contains the following components:

(I) an aminosilane compound of the following general formula [1];

(II) a silicon compound of the following general formula [2]; and (III) an aprotic solvent, and wherein the amount of the component (I) contained in the liquid chemical is 0.02 to 0.5 mass % based on the total amount of the components (I) to (III).

$$(R^1)_a Si(H)_b (NH_2)_{4-a-b} \quad [1]$$

In the general formula [1], $R^1$ is each independently a monovalent organic group having a monovalent hydrocarbon structure of 1 to 18 carbon atoms in which a part or all of hydrogen atoms may be substituted with a fluorine atom; a is an integer of 1 to 3; b is an integer of 0 to 2; and the sum of a and b is 1 to 3.

$$(R^2)_c Si(H)_d X_{4-c-d} \quad [2]$$

In the general formula [2], $R^2$ is each independently a monovalent organic group having a monovalent hydrocarbon structure of 1 to 18 carbon atoms in which a part or all of hydrogen atoms may be substituted with a fluorine atom; X is at least one group selected from the group consisting of a halogen atom, a —OC(=O)$R^3$ group, a —OS(=O)$_2$—$R^3$ group, a —N(S(=O)$_2$—$R^3$)$_2$ group and a —C(S(=O)$_2$—$R^3$)$_3$ group where $R^3$ is a monovalent perfluoroalkyl group of 1 to 6 carbon atoms; c is an integer of 1 to 3; d is an integer of 0 to 2; and the sum of c and d is 1 to 3.

The component (I) is preferably a compound of the following general formula [3] for uniform protective film formation.

$$(R^1)_e Si(H)_f NH_2 \quad [3]$$

In the general formula [3], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

In the surface treatment method, it is preferable that the liquid chemical further contains the following component: (IV) a silazane compound of the following general formula [4] for ease of liquid chemical preparation.

$$[(R^1)_e Si(H)_f]_2 NH \quad [4]$$

In the general formula [4], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

For ease of liquid chemical preparation, it is preferable that the surface treatment method includes, before the water-repellent protective film-forming step, a liquid chemical preparation step of bringing, into contact with a raw chemical containing the following components: (II) the silicon compound of the above general formula [2]; (IV) a silazane compound of the following general formula [4]; and (III) the aprotic solvent, a protic compound in an amount of 0.001 to 0.3 mol per 1 kg of the total amount of the components (II), (III) and (IV), thereby preparing the water-repellent protective film-forming liquid chemical containing the components (I) to (III) wherein the amount of the component (I) contained in the liquid chemical is 0.02 to 0.5 mass % based on the total amount of the components (I) to (III).

$$[(R^1)_e Si(H)_f]_2 NH \quad [4]$$

In the general formula [4], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

It is also preferable, for ease of liquid chemical preparation, that the surface treatment method includes, before the water-repellent protective film-forming step, a liquid chemical preparation step of bringing, into contact with a raw chemical containing the following components: (II) the silicon compound of the above general formula [2]; (IV) a silazane compound of the following general formula [4]; and (III) the aprotic solvent, a protic compound in an amount of 0.001 to 0.3 mol per 1 kg of the total amount of the components (II), (III) and (IV), thereby preparing the water-repellent protective film-forming liquid chemical containing the components (I) to (IV) wherein the amount of the component (I) contained in the liquid chemical is 0.02 to 0.5 mass % based on the total amount of the components (I) to (III).

$$[(R^1)_e Si(H)_f]_2 NH \quad [4]$$

In the general formula [4], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

In the above surface treatment method, the liquid chemical preparation step is preferably performed by introducing the raw chemical into a space containing the protic compound and thereby bringing the protic compound into contact with the raw chemical so as to facilitate uniform contact of the protic compound and the raw chemical. The protic compound contained in the space can be in liquid form or in gaseous form. In the case where the protic compound is in gaseous form, it is preferable to control the concentration (vol %) of the protic compound in the space and the time of contact of the protic compound with the raw chemical.

Further, the protic compound is preferably a compound having a —OH group and/or a —NH$_2$ group in terms of improvement in water repellency imparting effect in the above surface treatment method. Water and/or 2-propanol is more preferred. Particularly preferred is water.

In terms of cost with reduction of the number of raw materials used, it is preferable that the surface treatment method includes, before the water-repellent protective film-forming step, a liquid chemical preparation step of bringing, into contact with a raw chemical containing the following components: (IV) a silazane compound of the following general formula [4]; and (III) the aprotic solvent, an acidic compound of the following general formula [6] in an amount of 0.001 to 0.3 mol per 1 kg of the total amount of the components (III) and (IV), thereby preparing the water-repellent protective film-forming liquid chemical containing the components (I) to (III) wherein the amount of the component (I) contained in the liquid chemical is 0.02 to 0.5 mass % based on the total amount of the components (I) to (III).

$$[(R^1)_e Si(H)_f]_2 NH \quad [4]$$

In the general formula [4], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

$$H-X \quad [6]$$

In the general formula [6], X is a halogen atom, a —OC(=O)R$^3$ group, a —OS(=O)$_2$—R$^3$ group, a —N(S(=O)$_2$—R$^3$)$_2$ group or a —C(S(=O)$_2$—R$^3$)$_3$ group where R$^3$ is a monovalent perfluoroalkyl group of 1 to 6 carbon atoms.

It is also preferable, in terms of cost with reduction of the number of raw materials used, that the surface treatment method includes, before the water-repellent protective film-forming step, a liquid chemical preparation step of bringing, into contact with a raw chemical containing the following components: (IV) a silazane compound of the following general formula [4]; and (III) the aprotic solvent, an acidic compound of the following general formula [6] in an amount of 0.001 to 0.3 mol per 1 kg of the total amount of the components (III) and (IV), thereby preparing the water-repellent protective film-forming liquid chemical containing the components (I) to (IV) wherein the amount of the component (I) contained in the liquid chemical is 0.02 to 0.5 mass % based on the total amount of the components (I) to (III).

$$[(R^1)_e Si(H)_f]_2 NH \quad [4]$$

In the general formula [4], $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

$$H-X \quad [6]$$

In the general formula [6], X is a halogen atom, a —OC(=O)R$^3$ group, a —OS(=O)$_2$—R$^3$ group, a —N(S(=O)$_2$—R$^3$)$_2$ group or a —C(S(=O)$_2$—R$^3$)$_3$ group where R$^3$ is a monovalent perfluoroalkyl group of 1 to 6 carbon atoms.

In the surface treatment method, the amount of the component (II) contained in the liquid chemical is preferably 0.05 mass % or more based on the total amount of the components (I) to (III) in terms of improvement in water repellency imparting effect. In terms of cost, the amount of the component (II) contained in the liquid chemical is preferably 20 mass % or less based on the total amount of the components (I) to (III).

Furthermore, the component (II) is preferably at least one kind of compound selected from those of the following general formula [5] in terms of improvement in water repellency imparting effect in the surface treatment method.

$$(R^2)_g Si(OC(=O)R^3)_{4-g} \quad [5]$$

In the general formula [5], $R^2$ is each independently a monovalent organic group having a monovalent hydrocarbon structure of 1 to 18 carbon atoms in which a part or all of hydrogen atoms may be substituted with a fluorine atom; R$^3$ is a monovalent perfluoroalkyl group of 1 to 6 carbon atoms; and g is an integer of 1 to 3.

Effects of the Invention

According to the present disclosure, there are provided the water-repellent protective film-forming liquid chemical with a novel composition capable of exerting a superior water repellency imparting effect and the surface treatment method for the wafer with the use of such a liquid chemical.

DETAILED DESCRIPTION OF THE EMBODIMENTS

1. Water-Repellent Protective Film-Forming Liquid Chemical

Figure 1:
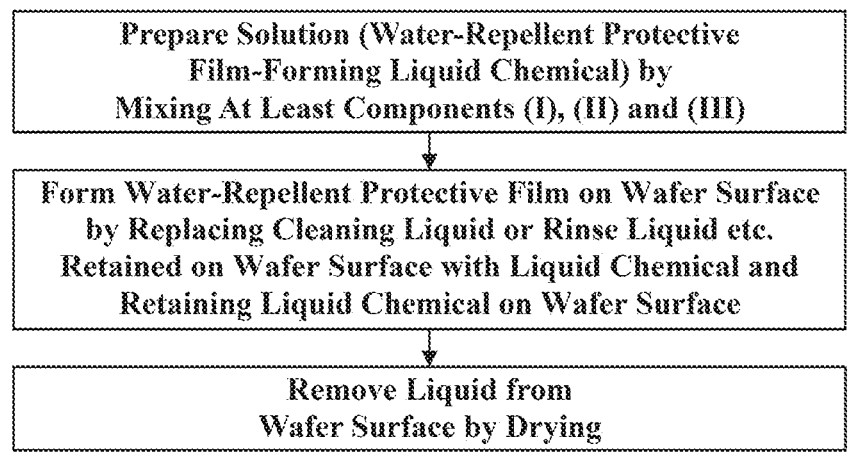
FIG. 1 is a flowchart of a surface treatment mode 1.

The water-repellent protective film-forming liquid chemical is used to form a water-repellent protective film (hereinafter also simply referred to as "protective film") on a surface of a workpiece. There is no particular limitation on the workpiece. The workpiece is preferably a "substrate (wafer)". Examples of the "wafer" as the workpiece are those used for manufacturing of semiconductor devices. A "surface of the wafer" refers to a surface of the wafer itself, a surface of an inorganic pattern or resin pattern formed on the wafer, or a surface of an unpatterned inorganic layer or organic layer formed on the wafer.

An example of the inorganic pattern formed on the wafer is a pattern formed by providing an etching mask by a photoresist technique on an inorganic layer present on the substrate and etching the inorganic layer through the etching mask. The inorganic layer can be the wafer itself, an oxide film of an element constituting the wafer, a film or layer of inorganic substance such as silicon nitride, titanium nitride or tungsten formed on the wafer etc. There is no particular limitation on such a film or layer. The film or layer may be any film or layer of inorganic substance formed during the manufacturing process of the semiconductor device.

An example of the resin pattern formed on the wafer is a resin pattern formed by a photoresist technique on the wafer. This resin pattern is obtained by providing an organic layer as a photoresist film on the wafer, exposing the organic layer to light through a photomask and developing the exposed organic layer. The organic layer can be the surface of the wafer itself, a surface of a laminated film provided on the surface of the wafer etc. There is no particular limitation on the organic layer. The organic layer may be a film of organic substance applied for formation of the etching mask during the manufacturing of the semiconductor device.

The liquid chemical according to the present disclosure, which has been prepared in advance, can be applied to the surface of the workpiece such as wafer by a spin coating method, an immersion method etc. and thereby retained on the surface of the workpiece. Alternatively, the liquid chemical can be retained on the surface of the workpiece such as wafer by a method of vaporizing the liquid chemical and supplying the resulting vapor of the liquid chemical to the surface of the workpiece (also referred to as "vapor method").

It is alternatively feasible to prepare the water-repellent protective film-forming liquid chemical through the after-mentioned reaction by, in a state that the raw chemical has been applied to the surface of the workpiece such as wafer by a spin coating method, an immersion method, a vapor method etc., bringing the protic compound into contact with the raw chemical, and then, retain the liquid chemical on the surface of the workpiece.

It is also alternatively feasible to prepare the water-repellent protective film-forming liquid chemical through the after-mentioned reaction by applying the raw chemical to the surface of the workpiece such as wafer by a spin coating method, an immersion method, a vapor method etc. in a space into which the protic compound has been put in advance, and then, retain the liquid chemical on the surface of the workpiece.

The water-repellent protective film-forming liquid chemical according to the present disclosure contains at least the following components: (I) the aminosilane compound; (II) the silicon compound; and (III) the aprotic solvent. Hereinafter, the respective components will be explained below.

[(I) Aminosilane Compound and (II) Silicon Compound]

Both of $R^1$ in the above general formula [1] and $R^2$ in the above general formula [2] are water-repellent functional groups. In the case of using a silicon-containing wafer as the workpiece, a $-NH_2$ group in the general formula [1] and a $-X$ group in the general formula [2] react with a silanol group on a surface of the wafer, whereby moieties with the water-repellent functional groups are fixed to the surface of the wafer. As a result, there is formed a water-repellent protective film on the surface of the wafer. The combined use of the components (I) and (II) enables quick reaction of these components with the wafer surface so as to thereby exert a better water repellency imparting effect.

Preferably, $R^1$ in the general formula [1] is a linear alkyl group so as to, when the protective film is formed on the surface of the wafer as the workpiece, impart better water repellency to the wafer surface.

Specific examples of the aminosilane compound of the general formula [1] include $CH_3Si(NH_2)_3$, $C_2H_5Si(NH_2)_3$, $C_3H_7Si(NH_2)_3$, $C_4H_9Si(NH_2)_3$, $C_5H_{11}Si(NH_2)_3$, $C_6H_{13}Si(NH_2)_3$, $C_7H_{15}Si(NH_2)_3$, $C_8H_{17}Si(NH_2)_3$, $C_9H_{19}Si(NH_2)_3$, $C_{10}H_{21}Si(NH_2)_3$, $C_{11}H_{23}Si(NH_2)_3$, $C_{12}H_{25}Si(NH_2)_3$, $C_{13}H_{27}Si(NH_2)_3$, $C_{14}H_{29}Si(NH_2)_3$, $C_{15}H_{31}Si(NH_2)_3$, $C_{16}H_{33}Si(NH_2)_3$, $C_{17}H_{35}Si(NH_2)_3$, $C_{18}H_{37}Si(NH_2)_3$, $(CH_3)_2Si(NH_2)_2$, $C_2H_5Si(CH_3)(NH_2)_2$, $(C_2H_5)_2Si(NH_2)_2$, $C_3H_7Si(CH_3)(NH_2)_2$, $(C_3H_7)_2Si(NH_2)_2$, $C_4H_9Si(CH_3)(NH_2)_2$, $(C_4H_9)_2Si(NH_2)_2$, $C_5H_{11}Si(CH_3)(NH_2)_2$, $C_6H_{13}Si(CH_3)(NH_2)_2$, $C_7H_{15}Si(CH_3)(NH_2)_2$, $C_8H_{17}Si(CH_3)(NH_2)_2$, $C_9H_{19}Si(CH_3)(NH_2)_2$, $C_{10}H_{21}Si(CH_3)(NH_2)_2$, $C_{11}H_{23}Si(CH_3)(NH_2)_2$, $C_{12}H_{25}Si(CH_3)(NH_2)_2$, $C_{13}H_{27}Si(CH_3)(NH_2)_2$, $C_{14}H_{29}Si(CH_3)(NH_2)_2$, $C_{15}H_{31}Si(CH_3)(NH_2)_2$, $C_{16}H_{33}Si(CH_3)(NH_2)_2$, $C_{17}H_{35}Si(CH_3)(NH_2)_2$, $C_{18}H_{37}Si(CH_3)(NH_2)_2$, $(CH_3)_3SiNH_2$, $C_2H_5Si(CH_3)_2NH_2$, $(C_2H_5)_2Si(CH_3)NH_2$, $(C_2H_5)_3SiNH_2$, $C_3H_7Si(CH_3)_2NH_2$, $(C_3H_7)_2Si(CH_3)NH_2$, $(C_3H_7)_3SiNH_2$, $C_4H_9Si(CH_3)_2NH_2$, $(C_4H_9)_3SiNH_2$, $C_5H_{11}Si(CH_3)_2NH_2$, $C_6H_{13}Si(CH_3)_2NH_2$, $C_7H_{15}Si(CH_3)_2NH_2$, $C_8H_{17}Si(CH_3)_2NH_2$, $C_9H_{19}Si(CH_3)_2NH_2$, $C_{10}H_{21}Si(CH_3)_2NH_2$, $C_{11}H_{23}Si(CH_3)_2NH_2$, $C_{12}H_{25}Si(CH_3)_2NH_2$, $C_{13}H_{27}Si(CH_3)_2NH_2$, $C_{14}H_{29}Si(CH_3)_2NH_2$, $C_{15}H_{31}Si(CH_3)_2NH_2$, $C_{16}H_{33}Si(CH_3)_2NH_2$, $C_{17}H_{35}Si(CH_3)_2NH_2$, $C_{18}H_{37}Si(CH_3)_2NH_2$, $(CH_3)_2Si(H)NH_2$, $CH_3Si(H)_2NH_2$, $(C_2H_5)_2Si(H)NH_2$, $C_2H_5Si(H)_2NH_2$, $C_2H_5Si(CH_3)(H)NH_2$, $(C_3H_7)_2Si(H)NH_2$, $C_3H_7Si(H)_2NH_2$, $CF_3CH_2CH_2Si(NH_2)_3$, $C_2F_5CH_2CH_2Si(NH_2)_3$, $C_3F_7CH_2CH_2Si(NH_2)_3$, $C_4F_9CH_2CH_2Si(NH_2)_3$, $C_5F_{11}CH_2CH_2Si(NH_2)_3$, $C_6F_{13}CH_2CH_2Si(NH_2)_3$, $C_7F_{15}CH_2CH_2Si(NH_2)_3$, $C_8F_{17}CH_2CH_2Si(NH_2)_3$, $CF_3CH_2CH_2Si(CH_3)(NH_2)_2$, $C_2F_5CH_2CH_2Si(CH_3)(NH_2)_2$, $C_3F_7CH_2CH_2Si(CH_3)(NH_2)_2$, $C_4F_9CH_2CH_2Si(CH_3)(NH_2)_2$, $C_5F_{11}CH_2CH_2Si(CH_3)(NH_2)_2$, $C_6F_{13}CH_2CH_2Si$ $(CH_3)(NH_2)_2$, $C_7F_{15}CH_2CH_2Si(CH_3)(NH_2)_2$, $C_8F_{17}CH_2CH_2Si(CH_3)(NH_2)_2$, $CF_3CH_2CH_2Si(CH_3)_2NH_2$, $C_2F_5CH_2CH_2Si(CH_3)_2NH_2$, $C_3F_7CH_2CH_2Si(CH_3)_2NH_2$, $C_4F_9CH_2CH_2Si(CH_3)_2NH_2$, $C_5F_{11}CH_2CH_2Si(CH_3)_2NH_2$, $C_6F_{13}CH_2CH_2Si(CH_3)_2NH_2$, $C_7F_{15}CH_2CH_2Si(CH_3)_2NH_2$, $C_8F_{17}CH_2CH_2Si(CH_3)_2NH_2$ and $CF_3CH_2CH_2Si(CH_3)(H)NH_2$.

For uniform formation of the protective film, the number of —NH$_2$ groups as represented by 4-a-b in the general formula [1] is preferably 1.

Further, b in the general formula [1] is preferably 0 so as to, even when the after-mentioned cleaning (or rinse) operation is performed after the formation of the protective film, readily maintain the water repellency of the protective film.

The combination of two CH$_3$ groups and one linear alkyl group is preferable as R$^1$ for uniform formation of the protective film. More preferably, R$^1$ are three CH$_3$ groups.

The aminosilane compound of the general formula [1] may be provided by reaction.

The amount of the aminosilane compound contained as the component (I) in the liquid chemical is 0.02 to 0.5 mass % based on the total amount of the components (I) to (III). When the amount of the aminosilane compound contained in the liquid chemical is less than 0.02 mass %, a further improvement of the water repellency imparting effect is not achieved. When the amount of the aminosilane compound contained in the liquid chemical exceeds 0.5 mass %, there tends to occur reaction between molecules of the aminosilane compound so that it becomes difficult to prepare the liquid chemical. The amount of the aminosilane compound contained in the liquid chemical is preferably 0.03 to 0.4 mass %, more preferably 0.03 to 0.3 mass %.

Specific examples of the silicon compound of the general formula [2] include: trifluoroacetoxysilanes such as $CH_3Si(OC(=O)CF_3)_3$, $C_2H_5Si(OC(=O)CF_3)_3$, $C_3H_7Si(OC(=O)CF_3)_3$, $C_4H_9Si(OC(=O)CF_3)_3$, $C_5H_{11}Si(OC(=O)CF_3)_3$, $C_6H_{13}Si(OC(=O)CF_3)_3$, $C_7H_{15}Si(OC(=O)CF_3)_3$, $C_8H_{17}Si(OC(=O)CF_3)_3$, $C_9H_{19}Si(OC(=O)CF_3)_3$, $C_{10}H_{21}Si(OC(=O)CF_3)_3$, $C_{11}H_{23}Si(OC(=O)CF_3)_3$, $C_{12}H_{25}Si(OC(=O)CF_3)_3$, $C_{13}H_{27}Si(OC(=O)CF_3)_3$, $C_{14}H_{29}Si(OC(=O)CF_3)_3$, $C_{15}H_{31}Si(OC(=O)CF_3)_3$, $C_{16}H_{33}Si(OC(=O)CF_3)_3$, $C_{17}H_{35}Si(OC(=O)CF_3)_3$, $C_{18}H_{37}Si(OC(=O)CF_3)_3$, $(CH_3)_2Si(OC(=O)CF_3)_2$, $C_2H_5Si(CH_3)(OC(=O)CF_3)_2$, $(C_2H_5)_2Si(OC(=O)CF_3)_2$, $C_3H_7Si(CH_3)(OC(=O)CF_3)_2$, $(C_3H_7)_2Si(OC(=O)CF_3)_2$, $C_4H_9Si(CH_3)(OC(=O)CF_3)_2$, $(C_4H_9)_2Si(OC(=O)CF_3)_2$, $C_5H_{11}Si(CH_3)(OC(=O)CF_3)_2$, $C_6H_{13}Si(CH_3)(OC(=O)CF_3)_2$, $C_7H_{15}Si(CH_3)(OC(=O)CF_3)_2$, $C_8H_{17}Si(CH_3)(OC(=O)CF_3)_2$, $C_9H_{19}Si(CH_3)(OC(=O)CF_3)_2$, $C_{10}H_{21}Si(CH_3)(OC(=O)CF_3)_2$, $C_{11}H_{23}Si(CH_3)(OC(=O)CF_3)_2$, $C_{12}H_{25}Si(CH_3)(OC(=O)CF_3)_2$, $C_{13}H_{27}Si(CH_3)(OC(=O)CF_3)_2$, $C_{14}H_{29}Si(CH_3)(OC(=O)CF_3)_2$, $C_{15}H_{31}Si(CH_3)(OC(=O)CF_3)_2$, $C_{16}H_{33}Si(CH_3)(OC(=O)CF_3)_2$, $C_{17}H_{35}Si(CH_3)(OC(=O)CF_3)_2$, $C_{18}H_{37}Si(CH_3)(OC(=O)CF_3)_2$, $(CH_3)_3SiOC(=O)CF_3$, $C_2H_5Si(CH_3)_2OC(=O)CF_3$, $(C_2H_5)_2Si(CH_3)OC(=O)CF_3$, $(C_2H_5)_3SiOC(=O)CF_3$, $C_3H_7Si(CH_3)_2OC(=O)CF_3$, $(C_3H_7)_2Si(CH_3)OC(=O)CF_3$, $(C_3H_7)_3SiOC(=O)CF_3$, $C_4H_9Si(CH_3)_2OC(=O)CF_3$, $(C_4H_9)_3SiOC(=O)CF_3$, $C_5H_{11}Si(CH_3)_2OC(=O)CF_3$, $C_6H_{13}Si(CH_3)_2OC(=O)CF_3$, $C_7H_{15}Si(CH_3)_2OC(=O)CF_3$, $C_8H_{17}Si(CH_3)_2OC(=O)CF_3$, $C_9H_{19}Si(CH_3)_2OC(=O)CF_3$, $C_{10}H_{21}Si(CH_3)_2OC(=O)CF_3$, $C_{11}H_{23}Si(CH_3)_2OC(=O)CF_3$, $C_{12}H_{25}Si(CH_3)_2OC(=O)CF_3$, $C_{13}H_{27}Si(CH_3)_2OC(=O)CF_3$, $C_{14}H_{29}Si(CH_3)_2OC(=O)CF_3$, $C_{15}H_{31}Si(CH_3)_2OC(=O)CF_3$, $C_{16}H_{33}Si(CH_3)_2OC(=O)CF_3$, $C_{17}H_{35}Si(CH_3)_2OC(=O)CF_3$, $C_{18}H_{37}Si(CH_3)_2OC(=O)CF_3$, $(CH_3)_2Si(H)OC(=O)CF_3$, $CH_3Si(H)_2OC(=O)CF_3$, $(C_2H_5)_2Si(H)OC(=O)CF_3$, $C_2H_5Si(H)_2OC(=O)CF_3$, $C_2H_5Si(CH_3)(H)OC(=O)CF_3$, $(C_3H_7)_2Si(H)OC(=O)CF_3$, $C_3H_7Si(H)_2OC(=O)CF_3$, $CF_3CH_2CH_2Si(OC(=O)CF_3)_3$, $C_2F_5CH_2CH_2Si(OC(=O)CF_3)_3$, $C_3F_7CH_2CH_2Si(OC(=O)CF_3)_3$, $C_4F_9CH_2CH_2Si(OC(=O)CF_3)_3$, $C_5F_{11}CH_2CH_2Si(OC(=O)CF_3)_3$, $C_6F_{13}CH_2CH_2Si(OC(=O)CF_3)_3$, $C_7F_{15}CH_2CH_2Si(OC(=O)CF_3)_3$, $C_8F_{17}CH_2CH_2Si(OC(=O)CF_3)_3$, $CF_3CH_2CH_2Si(CH_3)(OC(=O)CF_3)_2$, $C_2F_5CH_2CH_2Si(CH_3)(OC(=O)CF_3)_2$, $C_3F_7CH_2CH_2Si(CH_3)(OC(=O)CF_3)_2$, $C_4F_9CH_2CH_2Si(CH_3)(OC(=O)CF_3)_2$, $C_5F_{11}CH_2CH_2Si(CH_3)(OC(=O)CF_3)_2$, $C_6F_{13}CH_2CH_2Si(CH_3)(OC(=O)CF_3)_2$, $C_7F_{15}CH_2CH_2Si(CH_3)(OC(=O)CF_3)_2$, $C_8F_{17}CH_2CH_2Si(CH_3)(OC(=O)CF_3)_2$, $CF_3CH_2CH_2Si(CH_3)_2OC(=O)CF_3$, $C_2F_5CH_2CH_2Si(CH_3)_2OC(=O)CF_3$, $C_3F_7CH_2CH_2Si(CH_3)_2OC(=O)CF_3$, $C_4F_9CH_2CH_2Si(CH_3)_2OC(=O)CF_3$, $C_5F_{11}CH_2CH_2Si(CH_3)_2OC(=O)CF_3$, $C_6F_{13}CH_2CH_2Si(CH_3)_2OC(=O)CF_3$, $C_7F_{15}CH_2CH_2Si(CH_3)_2OC(=O)CF_3$, $C_8F_{17}CH_2CH_2Si(CH_3)_2OC(=O)CF_3$ and $CF_3CH_2CH_2Si(CH_3)(H)OC(=O)CF_3$; and those obtained by replacing —OC(=O)CF$_3$ groups of the aforementioned trifluoroacetoxysilanes with a halogen atom or a —OC(=O)R$^3$, —OS(=O)$_2$—R$^3$, —N(S(=O)$_2$—R$^3$)$_2$ or —C(S(=O)$_2$—R$^3$)$_3$ group other than —OC(=O)CF$_3$ (where R$^3$ is a monovalent perfluoroalkyl group of 1 to 6 carbon atoms).

For uniform formation of the protective film, the number of —X groups as represented by 4-c-d in the general formula [2] is preferably 1.

Further, d in the general formula [2] is preferably 0 so as to, even when the after-mentioned cleaning (or rinse) operation is performed after the formation of the protective film, readily maintain the water repellency of the protective film.

The combination of two CH$_3$ groups and one linear alkyl group is preferable as R$^2$ for uniform formation of the protective film. More preferably, R$^2$ are three CH$_3$ groups.

The silicon compound of the general formula [2] may be provided by reaction.

The amount of the silicon compound contained as the component (II) in the liquid chemical is preferably 0.05 mass % or more in terms of improvement of the water repellency imparting effect. In terms of cost, the amount of the silicon compound contained in the liquid chemical is 20 mass % or less. The amount of the silicon compound contained in the liquid chemical is more preferably 0.1 to 15 mass %, still more preferably 0.2 to 10 mass %.

[(III) Aprotic Solvent]

The aprotic solvent is contained in the water-repellent protective film-forming liquid chemical according to the present disclosure. The use of the aprotic solvent makes it easy to perform surface treatment on the workpiece by a spin coating method, an immersion method, a vapor method etc. The use of the aprotic solvent also makes it easy to ensure the storage stability of the liquid chemical.

As the aprotic solvent, there can be used organic solvents such as hydrocarbon, ester, ether, ketone, halogen-containing solvent, sulfoxide solvent, sulfone solvent, lactone solvent, carbonate solvent, OH-free polyol derivative, NH-free nitrogen-containing solvent, silicone solvent and terpene solvent, and a mixture of two or more kinds thereof. Among others, a hydrocarbon, an ester, an ether, a halogen-containing solvent, a OH-free polyol derivative, and a mixture of two or more kinds thereof are preferred so as to form the protective film on the surface of the workpiece in a short time.

Examples of the hydrocarbon include n-hexane, n-heptane, n-octane, n-nonane, n-decane, n-undecane, n-dodecane, n-tetradecane, n-hexadecane, n-octadecane, n-eicosane, branched hydrocarbons with corresponding carbon numbers (such as isododecane, isocetane etc.), cyclohexane, methylcyclohexane, decalin, benzene, toluene, xylene, (orth-, meta- or para-)diethylbenzene, and 1,3,5-trimethylbenzene.

Examples of the ester include ethyl acetate, n-propyl acetate, i-propyl acetate, n-butyl acetate, i-butyl acetate, n-pentyl acetate, i-pentyl acetate, n-hexyl acetate, n-heptyl acetate, n-octyl acetate, n-pentyl formate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, methyl 3-methoxypropionate, ethyl 3-methoxypropionate, methyl 3-ethoxypropionate, ethyl 3-ethoxypropionate, and ethyl ethoxyacetate.

Examples of the ether include di-n-propyl ether, ethyl n-butyl ether, di-n-butyl ether, ethyl n-amyl ether, di-n-amyl ether, ethyl n-hexyl ether, di-n-hexyl ether, di-n-octyl ether, ethers having branched hydrocarbon groups with corresponding carbon numbers such as diisopropyl ether, diisoamyl ether etc., dimethyl ether, diethyl ether, methyl ethyl ether, methyl cyclopentyl ether, diphenyl ether, tetrahydrofuran, and dioxane.

Examples of the ketone include acetone, acetylacetone, methyl ethyl ketone, methyl propyl ketone, methyl butyl ketone, cyclohexanone, and isophorone.

Examples of the halogen-containing solvent include: perfluorocarbons such as perfluorooctane, perfluorononane, perfluorocyclopentane, perfluorocyclohexane, hexafluorobenzene etc.; hydrofluorocarbons such as 1,1,1,3,3-pentafluorobutane, octafluorocyclopentane, 2,3-dihydrodecafluoropentane, Zeorora H (available from Zeon Corporation) etc.; hydrofluoroethers such as methyl perfluoroisobutyl ether, methyl perfluorobutyl ether, ethyl perfluorobutyl ether, ethyl perfluoroisobutyl ether, Asahiklin AE-3000 (available from Asahi Glass Co., Ltd.), Novec 7100, Novec 7200, Novec 7300 and Novec 7600 (each available from 3M Company) etc.; chlorocarbons such as tetrachloromethane etc.; hydrochlorocarbons such as chloroform etc.; chlorofluorocarbons such as dichlorodifluoromethane etc.; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene etc.; perfluoroethers; and perfluoropolyethers.

Examples of the sulfoxide solvent include dimethyl sulfoxide.

Examples of the sulfone solvent include dimethyl sulfone, diethyl sulfone, bis(2-hydroxyethyl)sulfone and tetramethylene sulfone.

Example of the lactone solvent include β-propiolactone, γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone and ε-hexanolactone.

Examples of the carbonate solvent include dimethyl carbonate, ethyl methyl carbonate, diethyl carbonate and propylene carbonate.

Examples of the OH-free polyol derivative include ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerin triacetate, 3-methoxybutyl acetate, 3-methyl-3-methoxybutyl acetate and 3-methyl-3-methoxybutyl propionate.

Examples of the NH-free nitrogen-containing solvent include N,N-dimethylformamide, N,N-dimethylacetamide, N-methyl-2-pyrrolidone, N-ethyl-2-pyrrolidone, N-propyl-2-pyrrolidone, 1,3-dimethyl-2-imidazolidone, 1,3-diethyl-2-imidazolidone, 1,3-diisopropyl-2-imidazolidone, triethylamine and pyridine.

Examples of the silicone solvent include hexamethyldisiloxane, octamethyltrisiloxane, decamethyltetrasiloxane and dodecamethylpentasiloxane.

Examples of the terpene solvent include p-menthane, diphenyl menthane, limonene, terpinene, bornane, norbornane and pinane.

From the viewpoint of safety on the fire service act, the protic solvent is preferably of the type having a flash point exceeding 70° C. For example, a carbonate solvent and a OH-free polyalcohol derivative are preferred because of the facts that: there are a plurality of carbonate solvents and OH-free polyalcohol derivatives each having a high flash point; and the use of such a high-flash-point solvent leads to a decrease in the danger of the liquid chemical. From the viewpoint of safety, more preferred as the solvent are propylene carbonate, ethylene glycol dibutyl ether, ethylene glycol monobutyl ether acetate, ethylene glycol diacetate, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethyelene glycol diethyl ether, triethylene glycol dibutyl ether, triethylene glycol butyl methyl ether, trietylene glycol monomethyl ether acetate, triethylene glycol monoethyl ether acetate, triethyelene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol diacetate, dipropylene glycol methyl propyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol diacetate, glycerin triacetate etc., each of which has a flash point exceeding 70° C.

For further improvement in stability, the water-repellent protective film-forming liquid chemical according to the present disclosure may contain additives such as a polymerization inhibitor, a chain transfer agent, an antioxidant and the like.

It is preferable that, in a particle measurement made in a liquid phase of the liquid chemical by a light scattering type in-liquid particle detector, the number of particles of diameter larger than 0.2 μm is 100 or less per 1 mL of the liquid chemical. When the number of particles of diameter larger than 0.2 μm exceeds 100 per 1 mL of the liquid chemical, there unfavorably occurs a risk of damage to the wafer as the workpiece by the particles. This can lead to a deterioration in device yield and reliability. When the number of particles of diameter larger than 0.2 μm is 100 or less per 1 mL of the liquid chemical, it is favorably possible to omit or reduce the cleaning (or rinse) of the wafer surface (i.e. the surface of the protective film) with a solvent or water after the formation of the protective film. Although it is preferable that the number of particles of diameter larger than 0.2 μm in the liquid chemical is as less as possible, the number of particles of diameter larger than 0.2 μm may be 1 or more per 1 mL of the liquid chemical as long as within the above range. In the present disclosure, the particle measurement in the liquid phase of the liquid chemical can be made by a commercially available measurement device on the basis of a laser light scattering type in-liquid particle measuring method using a laser as a light source. The particle diameter means a light scattering equivalent diameter with reference to a PSL (polystyrene latex) standard particle.

Herein, the term "particles" include not only particles such as dust, dirt, organic solid matter and inorganic solid matter contained as impurities in the raw materials, but also particles such as dust, dirt, organic solid matter and inorganic solid matter introduced as contaminants during preparation of the liquid chemical, and refer to particles finally present without being dissolved in the liquid chemical.

Furthermore, it is preferable that the amount of respective Na, Mg, K, Ca, Mn, Fe, Cu, Li, Al, Cr, Ni, Zn and Ag elements (as metal impurity elements) in the liquid chemical is 0.1 mass ppb or less based on the total amount of the liquid chemical. When the amount of the metal impurity element in the liquid chemical exceeds 0.1 mass ppb based on the total amount of the liquid chemical, there unfavorably occurs a risk of increase in device junction leakage current. This can lead to a deterioration in device yield and reliability. When the amount of the metal impurity element in the liquid chemical is 0.1 mass ppb or less based on the total amount of the liquid chemical, it is favorably possible to omit or reduce the cleaning of the wafer surface (i.e. the surface of the protective film) with a solvent or water after the formation of the protective film. For this reason, it is preferable that the amount of the metal impurity elements in the liquid chemical is as small as possible. The amount of the metal impurity element in the liquid chemical may however be 0.001 mass ppb or more as long as within the above range.

2. Surface Treatment Method for Wafer

The surface treatment method for the wafer according to the present disclosure includes: a water-repellent protective film-forming step of, in a state that at least one kind of liquid selected from the group consisting of a cleaning liquid and a rinse liquid is retained on the surface of the wafer, replacing the liquid with the water-repellent protective film-forming liquid chemical and retaining the water-repellent protective film-forming liquid chemical on the surface of the wafer; and a drying step, wherein the water-repellent protective film-forming liquid chemical contains the following components: (I) the aminosilane compound of the above general formula [1]; (II) the silicon compound of the above general formula [2]; and (III) the aprotic solvent, and wherein the amount of the component (I) contained in the liquid chemical is 0.02 to 0.5 mass % based on the total amount of the components (I) to (III).

(Surface Treatment Mode 1)

As shown in FIG. 1, the solution (water-repellent protective film-forming liquid chemical) is prepared by mixing at least the components (I), (II) and (III) together in the surface treatment mode 1. The thus-obtained liquid chemical is supplied in liquid form or gaseous form to the surface of the wafer and retained in liquid form on the surface of the wafer.

The supply of the liquid chemical is done in the state that the liquid such as cleaning liquid or rinse liquid is retained on the surface of the wafer, whereby the liquid is replaced with the liquid chemical. In the replacement, there is no particular limitation on the liquid such as cleaning liquid or rinse liquid retained on the surface of the wafer. In general, the liquid is 2-propanol (iPA) or the like.

By the replacement, the liquid chemical is retained on the surface of the wafer so that the water-repellent protective film is formed on the surface of the wafer. Rinse treatment may be further performed, as required, to replace the liquid chemical on the surface of the wafer with a rinse liquid.

Then, the liquid is removed from the surface of the wafer by the drying. Since the water-repellent protective film has been formed on the surface of the wafer, the occurrence of pattern collapse during the drying is reduced due to good water repellency. The liquid removed by the drying can be the water-repellent protective film-forming liquid chemical, the rinse liquid, or a mixed liquid thereof. The removed liquid is the rinse liquid in the case where the rinse treatment has been performed to replace the liquid chemical with the rinse liquid. The removed liquid is the mixed liquid of the liquid chemical and the rinse liquid in the case where the mixed liquid generated during the replacement of the liquid chemical with the rinse liquid remains or in the case where the liquid chemical has been replaced with the mixed liquid prepared in advance by dissolving the liquid chemical in the rinse liquid. The same applies to the after-mentioned surface treatment modes 2 to 6.

In the surface treatment mode 1, there is no particular limitation on the order of mixing of the components (I) to (III) as the raw materials of the liquid chemical. It is however preferable to mix the components (I) and (II) into the protic solvent component (III).

The surface treatment method according to the present disclosure may include, before the water-repellent protective film-forming step, a liquid chemical preparation step of bringing, into contact with a raw chemical containing the following components: (II) the silicon compound of the above general formula [2]; (IV) the silazane compound of the above general formula [4]; and (III) the aprotic solvent, the protic compound in an amount of 0.001 to 0.3 mol per 1 kg of the total amount of the components (II), (III) and (IV), thereby preparing the water-repellent protective film-forming liquid chemical containing the components (I) to (III) wherein the amount of the component (I) contained in the liquid chemical is 0.02 to 0.5 mass % based on the total amount of the components (I) to (III).

There is no particular limitation on the technique on the method for contact of the protic compound with the raw chemical. It is feasible to adopt a known method for contact of the protic compound with the raw chemical. It is assumed that, when the water-repellent protective film-forming liquid chemical is prepared by the contact, there occur reactions as shown in the following reaction scheme although the details of the reaction mechanism are not clear. More specifically, the silicon compound of the above general formula [2] and the protic compound (A-H) react with each other to form a reaction product (X—H; acidic compound). The thus-formed reaction product reacts with the silazane compound of the above general formula [4], thereby forming the aminosilane compound of the above general formula [1]. As a result, obtained is the water-repellent protective film-forming liquid chemical containing the components (I) to (III) wherein the amount of the component (I) contained in the liquid chemical is 0.02 to 0.5 mass % based on the total amount of the components (I) to (III).

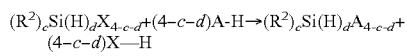

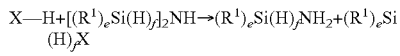

This surface treatment method can be embodied as the following surface treatment mode 2 or 3.

(Surface Treatment Mode 2)

Figure 2:
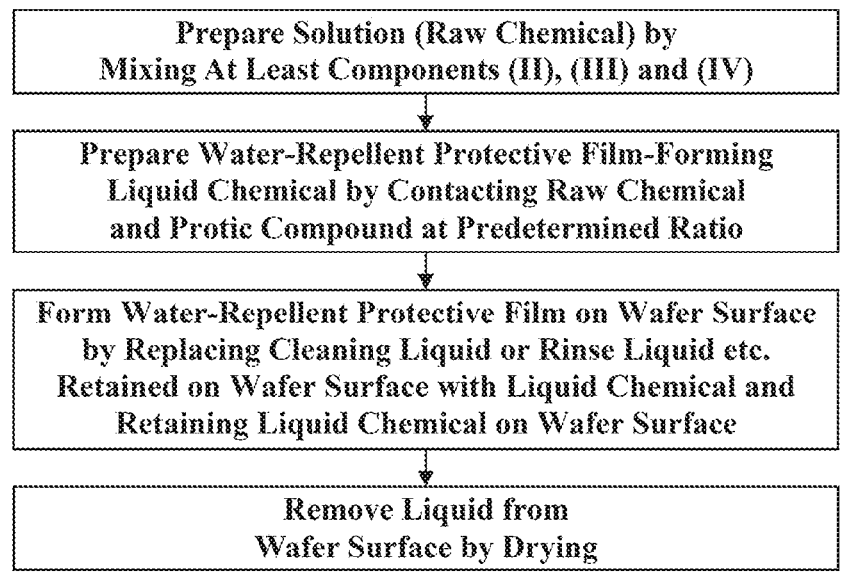
FIG. 2 is a flowchart of a surface treatment mode 2.

As shown in FIG. 2, the solution (raw chemical) is prepared by mixing at least the components (II), (III) and (IV) together. The water-repellent protective film-forming liquid chemical is then prepared by bringing, into contact with the raw chemical, the protic compound in an amount of 0.001 to 0.3 mol per 1 kg of the total amount of the components (II), (III) and (IV). The protic compound used for the contact may be diluted with (if not compatible, dispersed in) an aprotic solvent. Examples of the aprotic solvent usable for dilution of the protic compound are the same as those mentioned as the component (III) of the present disclosure.

The raw chemical and the protic compound used in the liquid chemical preparation step may be in liquid form or gaseous form. For example, it is feasible to mix the raw chemical and the protic compound, both in liquid form, in the container inside the chamber, in the tank or in the pipe at or downstream of the junction. It is alternatively feasible to mix the raw chemical and the protic compound, both in gaseous form, in the chamber, in the vaporization room or in the pipe at or downstream of the junction after the vaporization. As another alternative, it is feasible to expose the liquid raw chemical to the gaseous protic compound in the container inside the chamber and thereby bring the protic compound into contact with the raw chemical. The component (I) may be contained in the raw chemical.

The protic compound is preferably a compound having a —OH group and/or a —NH$_2$ group in terms of improvement in water repellency imparting effect. It is more preferable to use a compound having a —OH group and/or NH$_3$ as the protic compound. It is still more preferable to use water and/or an alcohol of 6 or less carbon atoms. It is particularly preferable to use water and/or 2-propanol.

As the alcohol of 6 or less carbon atoms, not only methanol, ethanol, linear or branched propanol, linear or branched butanol, linear or branched pentanol and linear or branched hexanol, but also a polyol and a OH-containing polyol derivative are usable. Examples of the polyol include ethylene glycol, diethylene glycol, dipropylene glycol, triethylene glycol, 1,2-propanediol, 1,3-propanediol, 1,2-butanediol, 1,3-butanediol, 1,4-butanediol and glycerin. Examples of the OH-containing polyol derivative include ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, butylene glycol monomethyl ether, diethylene glycol monomethyl ether and diethylene glycol monoethyl ether.

The protic compound is preferably brought into contact, in an amount of 0.001 to 0.3 mol per 1 kg of the total amount of the components (II), (III) and (IV), with the raw chemical in solution form so that the amount of the component (I) contained in the liquid chemical is easily controlled to 0.02 to 0.5 mass % based on the total amount of the components (I) to (III). The contact amount of the protic compound is more preferably 0.003 to 0.2 mol, still more preferably 0.003 to 0.1 mol.

The prepared liquid chemical is supplied in liquid form or gaseous form to the surface of the wafer and retained in liquid form on the surface of the wafer. Since the aminosilane compound is formed through the reactions as mentioned above, the liquid chemical in which the amount of the component (I) contained is in the range of 0.02 to 0.5 mass % based on the total amount of the components (I) to (III) is supplied to the surface of the wafer. On the other hand, it is preferable to supply the liquid chemical to the surface of the wafer within a day from the contact of the raw chemical and the protic compound such that the influence of a side reaction etc. on the composition of the liquid chemical is easily negligible. It is more preferable to supply the liquid chemical to the surface of the wafer within 5 hours from the contact. It is particularly preferable to supply the liquid chemical to the surface of the wafer within 1 hour from the contact.

The supply of the liquid chemical is done in the state that the liquid such as cleaning liquid or rinse liquid is retained on the surface of the wafer, whereby the liquid is replaced with the liquid chemical. In the case where the liquid such as cleaning liquid or rinse liquid is a protic compound, this protic compound is additionally brought into contact with the liquid chemical during the replacement. There is hence a possibility that the component (I) is newly formed by reaction of the additional protic compound with the component (II) and then reaction of the resulting reaction product (acidic compound) with the component (IV). In the replacement, however, the liquid such as cleaning liquid or rinse liquid is promptly replaced with the water-repellent protective film-forming liquid chemical so that there is almost no influence of reaction between the component (II) and the protic compound as the liquid. Consequently, the influence of the above-mentioned newly formation of the component (I) in the replacement is at a negligible level. In the replacement, there is no particular limitation on the liquid such as cleaning liquid or rinse liquid retained on the surface of the wafer. In general, the liquid is 2-propanol (iPA) or the like.

By the replacement, the liquid chemical is retained on the surface of the wafer so that the water-repellent protective film is formed on the surface of the wafer. Rinse treatment may be further performed, as required, to replace the liquid chemical on the surface of the wafer with a rinse liquid.

Then, the liquid is removed from the surface of the wafer by the drying. Since the water-repellent protective film has been formed on the surface of the wafer, the occurrence of pattern collapse during the drying is reduced due to good water repellency. The liquid removed by the drying can be the water-repellent protective film-forming liquid chemical, the rinse liquid, or a mixed liquid thereof.

(Surface Treatment Mode 3)

Figure 3:
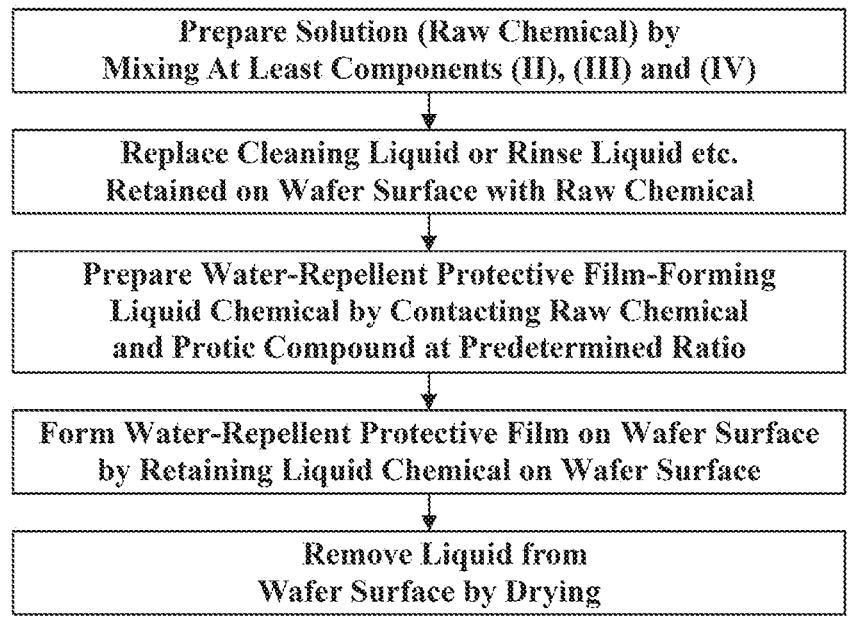
FIG. 3 is a flowchart of a surface treatment mode 3.

As shown in FIG. 3, the solution (raw chemical) is prepared by mixing at least the components (II), (III) and (IV) together. The raw chemical is supplied in liquid form or gaseous form to the surface of the wafer and retained in liquid form on the surface of the wafer.

The supply of the raw chemical is done in the state that the liquid such as cleaning liquid or rinse liquid is retained on the surface of the wafer, whereby the liquid is replaced with the raw chemical. In the case where the liquid such as cleaning liquid or rinse liquid is a protic compound e.g. water, alcohol etc., there is a possibility that that the component (I) is formed by reaction of this protic compound with the component (II) and reaction of the resulting reaction product (acidic compound) with the component (IV) during the replacement. In the replacement, however, the liquid such as cleaning liquid or rinse liquid is promptly replaced with the raw chemical so that there is almost no influence of reaction between the component (II) and the protic compound as the liquid. Consequently, the influence of the above-mentioned newly formation of the component (I) in the replacement is at a negligible level. In the replacement, there is no particular limitation on the liquid such as cleaning liquid or rinse liquid retained on the surface of the wafer. In general, the liquid is 2-propanol (iPA) or the like.

Next, the water-repellent protective film-forming liquid chemical is prepared on the surface of the wafer by bringing, into contact with the raw chemical, the protic acid in an amount of 0.001 to 0.3 mol per 1 kg of the total amount of the components (II), (III) and (IV). Since the aminosilane compound as the component (I) is formed through the reactions as mentioned above, the liquid chemical is retained on the surface of the wafer such that the amount of the component (I) contained is in the range of 0.02 to 0.5 mass % based on the total amount of the components (I) to (III).

The protic compound used for the contact may be diluted with (if not compatible, dispersed in) an aprotic solvent. Examples of the aprotic solvent usable for dilution of the protic compound are the same as those mentioned as the component (III) of the present disclosure.

The protic compound used in the liquid chemical preparation step may be in liquid form or gaseous form. For example, it is feasible to bring the protic compound into contact with the raw chemical by adding the liquid protic compound to the liquid raw chemical retained on the surface of the wafer in the chamber or by exposing the liquid raw chemical retained on the surface of the wafer to the gaseous protic compound in the chamber. In the latter case, the raw chemical may be supplied into the chamber in which a vapor atmosphere of a vapor of the protic compound at a predetermined concentration has been created.

In the case where the gaseous protic compound is brought into contact with the raw chemical, it is preferable that the liquid raw chemical is spread on the surface of the wafer and contacted with the gaseous protic compound so as to ensure a large contact area between the raw chemical and the protic compound and introduce the protic compound in a short time. At this time, the concentration of gaseous protic compound in the space is preferably 0.05 to 5 vol %, more preferably 0.1 to 2 vol %; and the contact time is preferably 0.1 to 600 seconds, more preferably 2 to 180 seconds. It is feasible to appropriately adopt a known method for spreading the raw chemical on the surface of the wafer. Among others, a spin coating method is preferred.

The above-prepared liquid chemical is retained on the surface of the wafer so that the water-repellent protective film is formed on the surface of the wafer. Rinse treatment may be further performed, as required, to replace the liquid chemical on the surface of the wafer with a rinse liquid.

Then, the liquid is removed from the surface of the wafer by the drying. Since the water-repellent protective film has been formed on the surface of the wafer, the occurrence of pattern collapse during the drying is reduced due to good water repellency. The liquid removed by the drying can be the water-repellent protective film-forming liquid chemical, the rinse liquid, or a mixed liquid thereof.

The surface treatment method according to the present disclosure may include, before the water-repellent protective film-forming step, a liquid chemical preparation step of bringing, into contact with a raw chemical containing the following components: (IV) the silazane compound of the above general formula [4]; and (III) the aprotic solvent, the acidic compound of the above general formula [6] in an amount of 0.001 to 0.3 mol per 1 kg of the total amount of the components (III) and (IV), thereby preparing the water-repellent protective film-forming liquid chemical containing the components (I) to (III) wherein the amount of the component (I) contained in the liquid chemical is 0.02 to 0.5 mass % based on the total amount of the components (I) to (III).

There is no particular limitation on the method for contact of the acidic compound with the raw chemical. It is feasible to adopt a known method for contact of the acidic compound with the raw chemical It is assumed that, when the water-repellent protective film-forming liquid chemical is prepared by the contact, there occurs a reaction as shown in the following reaction scheme although the details of the reaction mechanism are not clear. More specifically, the silazane compound of the above general formula [4] and the acidic compound of the above general formula [6] react with each other, thereby forming the aminosilane compound of the above general formula [1] and the silicon compound of the above general formula [2]. As a result, obtained is the water-repellent protective film-forming liquid chemical containing the components (I) to (III) wherein the amount of the component (I) contained in the liquid chemical is 0.02 to 0.5 mass % based on the total amount of the components (I) to (III).

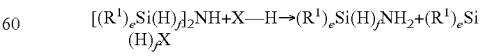

$[(R^1)_eSi(H)_f]_2NH+X-H\rightarrow(R^1)_eSi(H)_fNH_2+(R^1)_eSi(H)_fX$

The acidic compound is preferably brought into contact, in an amount of 0.001 to 0.3 mol per 1 kg of the total amount of the components (III) and (IV), with the raw chemical so that the amount of the component (I) contained in the liquid chemical is easily controlled to 0.02 to 0.5 mass % based on the total amount of the components (I) to (III). The contact amount of the acidic compound is more preferably 0.003 to 0.2 mol, still more preferably 0.003 to 0.1 mol.

This surface treatment method can be embodied as the following surface treatment mode 4 or 5.

(Surface Treatment Mode 4)

Figure 4:
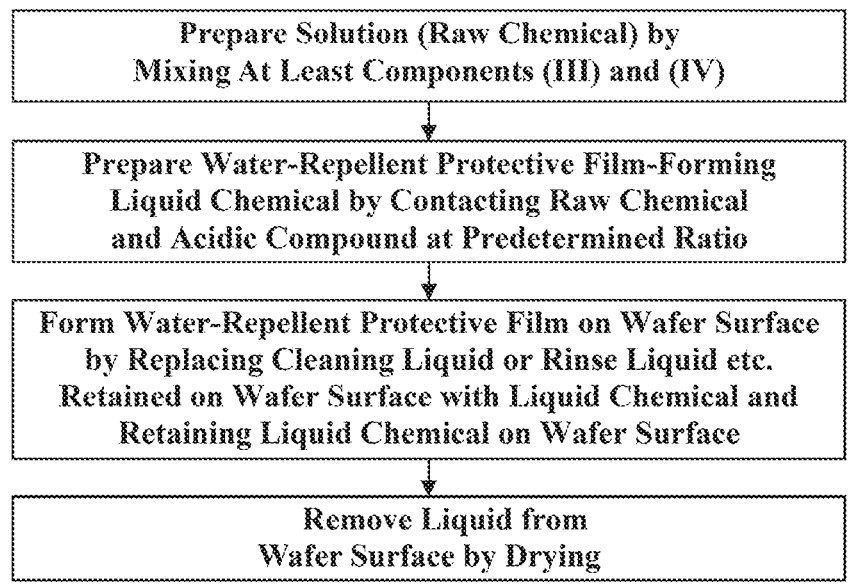
FIG. 4 is a flowchart of a surface treatment mode 4.

As shown in FIG. 4, the solution (raw chemical) is prepared by mixing at least the components (III) and (IV) together. The water-repellent protective film-forming liquid chemical is then prepared by bringing, into contact with the raw chemical, the acidic compound in an amount of 0.001 to 0.3 mol per 1 kg of the total amount of the components (III) and (IV). The acidic compound used for the contact may be diluted with (if not compatible, dispersed in) an aprotic solvent. Examples of the aprotic solvent usable for dilution of the acidic compound are the same as those mentioned as the component (III) of the present disclosure.

The raw chemical and the acidic compound used in the liquid chemical preparation step may be in liquid form or gaseous form. For example, it is feasible to mix the raw chemical and the acidic compound, both in liquid form, in the container inside the chamber, in the tank or in the pipe at or downstream of the junction. It is alternatively feasible to mix the raw chemical and the acidic compound, both in gaseous form, in the chamber, in the vaporization room or in the pipe at or downstream of the junction after the vaporization. As another alternative, it is feasible to expose the liquid raw chemical to the gaseous acidic compound in the container inside the chamber and thereby bring the acidic compound into contact with the raw chemical.

The prepared liquid chemical is supplied in liquid form or gaseous form to the surface of the wafer and retained in liquid form on the surface of the wafer. Since the aminosilane compound as the component (I) is formed through the reaction as mentioned above, the liquid chemical in which the amount of the component (I) contained is in the range of 0.02 to 0.5 mass % based on the total amount of the components (I) to (III) is supplied to the surface of the wafer. On the other hand, it is preferable to supply the liquid chemical to the surface of the wafer within a day from the contact of the raw chemical and the acidic compound such that the influence of a side reaction etc. on the composition of the liquid chemical is easily negligible. It is more preferable to supply the liquid chemical to the surface of the wafer within 5 hours from the contact. It is particularly preferable to supply the liquid chemical to the surface of the wafer within 1 hour from the contact.

The supply of the liquid chemical is done in the state that the liquid such as cleaning liquid or rinse liquid is retained on the surface of the wafer, whereby the liquid is replaced with the liquid chemical. In the replacement, there is no particular limitation on the liquid such as cleaning liquid or rinse liquid retained on the surface of the wafer. In general, the liquid is 2-propanol (iPA) or the like.

By the replacement, the liquid chemical is retained on the surface of the wafer so that the water-repellent protective film is formed on the surface of the wafer. Rinse treatment may be further performed, as required, to replace the liquid chemical on the surface of the wafer with a rinse liquid.

Then, the liquid is removed from the surface of the wafer by the drying. Since the water-repellent protective film has been formed on the surface of the wafer, the occurrence of pattern collapse during the drying is reduced due to good water repellency. The liquid removed by the drying can be the water-repellent protective film-forming liquid chemical, the rinse liquid, or a mixed liquid thereof.

(Surface Treatment Mode 5)

Figure 5:
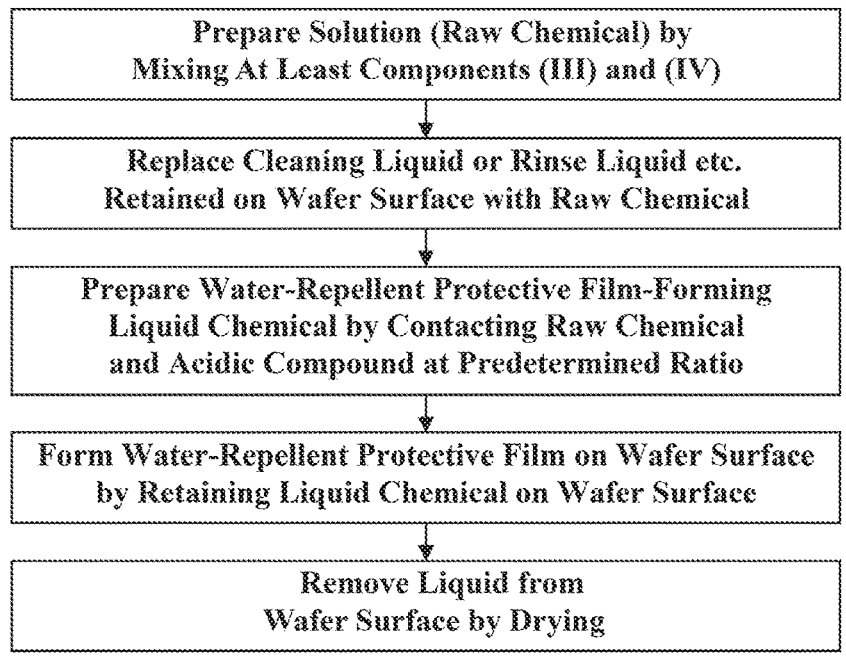
FIG. 5 is a flowchart of a surface treatment mode 5.

As shown in FIG. 5, the solution (raw chemical) is prepared by mixing at least the components (III) and (IV) together. The raw chemical is supplied in liquid form or gaseous form to the surface of the wafer and retained in liquid form on the surface of the wafer.

The supply of the raw chemical is done in the state that the liquid such as cleaning liquid or rinse liquid is retained on the surface of the wafer, whereby the liquid is replaced with the raw chemical. In the replacement, there is no particular limitation on the liquid such as cleaning liquid or rinse liquid retained on the surface of the wafer. In general, the liquid is 2-propanol (iPA) or the like.

Next, the water-repellent protective film-forming liquid chemical is prepared on the surface of the wafer by bringing, into contact with the raw chemical, the acidic acid in an amount of 0.001 to 0.3 mol per 1 kg of the total amount of the components (III) and (IV). Since the aminosilane compound as the component (I) is formed through the reaction as mentioned above, the liquid chemical is retained on the surface of the wafer such that the amount of the component (I) contained is in the range of 0.02 to 0.5 mass % based on the total amount of the components (I) to (III).

The acidic compound used for the contact may be diluted with (if not compatible, dispersed in) an aprotic solvent. Examples of the aprotic solvent usable for dilution of the acidic compound are the same as those mentioned as the component (III) of the present disclosure. The acidic compound used in the liquid chemical preparation step may be in liquid form or gaseous form. For example, it is feasible to bring the acidic compound into contact with the raw chemical by adding the liquid acidic compound to the liquid raw chemical retained on the surface of the wafer in the chamber or by exposing the liquid raw chemical retained on the surface of the wafer to the gaseous acidic compound in the chamber. In the latter case, the raw chemical may be supplied into the chamber in which a vapor atmosphere of a vapor of the acidic compound at a predetermined concentration has been created.

In the case where the gaseous acid compound is brought into contact with the raw chemical, it is preferable that the liquid raw chemical is spread on the surface of the wafer and contacted with the gaseous acidic compound so as to ensure a large contact area between the raw chemical and the acidic compound and introduce the acidic compound in a short time. At this time, the concentration of gaseous acidic compound in the space is preferably 0.05 to 5 vol %, more preferably 0.1 to 2 vol %; and the contact time is preferably 0.01 to 600 seconds, more preferably 0.1 to 180 seconds. It is feasible to appropriately adopt a known method for spreading the raw chemical on the surface of the wafer. Among others, a spin coating method is preferred.

The above-prepared liquid chemical is retained on the surface of the wafer so that the water-repellent protective film is formed on the surface of the wafer. Rinse treatment may be further performed, as required, to replace the liquid chemical on the surface of the wafer with a rinse liquid.

Then, the liquid is removed from the surface of the wafer by the drying. Since the water-repellent protective film has been formed on the surface of the wafer, the occurrence of pattern collapse during the drying is reduced due to good water repellency. The liquid removed by the drying can be the water-repellent protective film-forming liquid chemical, the rinse liquid, or a mixed liquid thereof.

Further, the surface treatment method may be embodied as the following surface treatment mode 6.

(Surface Treatment Mode 6)

Figure 6:
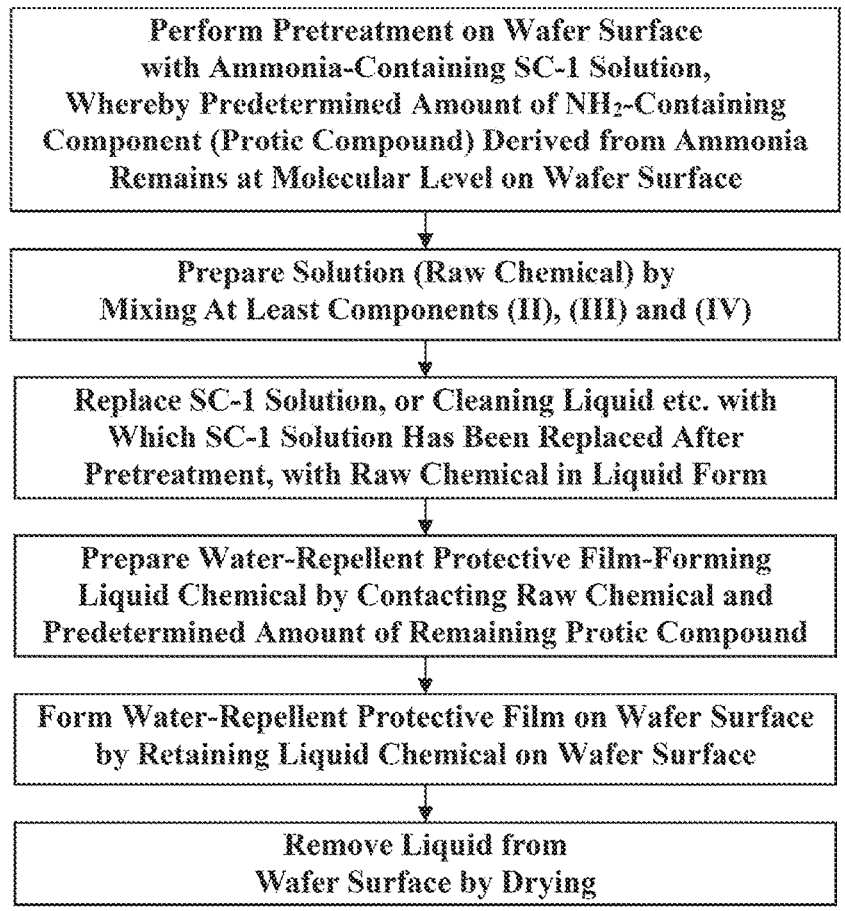
FIG. 6 is a flowchart of a surface treatment mode 6.

For example, when the surface of the wafer is subjected to pretreatment with an ammonia-containing SC-1 solution, a $NH_2$-containing component (protic compound) derived from the ammonia tends to remain at a molecular level on the surface of the wafer. As shown in FIG. 6, the solution (raw chemical) prepared by mixing at least the components (II), (III) and (IV) together is supplied in liquid form or gaseous form to the surface of the wafer on which a predetermined amount of the $NH_2$-containing component (protic compound) remains at the molecular level, whereby the SC-1 solution or the cleaning liquid etc. with which the SC-1 solution has been replaced after the pretreatment is replaced with the liquid raw chemical. The water-repellent protective film-forming liquid chemical is prepared on the surface of the wafer by contact of the raw chemical is brought with the predetermined amount of the $NH_2$-containing component (protic compound) remaining at the molecular level, and then, is retained on the surface of the wafer. In this way, the water-repellent protective film-forming step is performed. The drying step is subsequently performed.

The surface treatment mode 3 is preferred from the viewpoint of easily suppressing heat generation during the reaction.

Specific examples of the silazane compound of the general formula [4] include $[(CH_3)_3Si]_2NH$, $[(CH_3)_2Si(H)]_2NH$, $[CH_3Si(H)_2]_2NH$, $[C_2H_5Si(CH_3)_2]_2NH$, $[(C_2H_5)_2Si(CH_3)]_2NH$, $[(C_2H_5)_3Si]_2NH$, $[C_3H_7Si(CH_3)_2]_2NH$, $[(C_3H_7)_2Si(CH_3)]_2NH$, $[(C_3H_7)_3Si]_2NH$, $[C_4H_9Si(CH_3)_2]_2NH$, $[C_5H_{11}Si(CH_3)_2]_2NH$, $[C_6H_{13}Si(CH_3)_2]_2NH$, $[C_7H_{15}Si(CH_3)_2]_2NH$, $[C_8H_{17}Si(CH_3)_2]_2NH$, $[C_9H_{19}Si(CH_3)_2]_2NH$, $[C_{10}H_{21}Si(CH_3)_2]_2NH$, $[C_{11}H_{23}Si(CH_3)_2]_2NH$, $[C_{12}H_{25}Si(CH_3)_2]_2NH$, $[C_{13}H_{27}Si(CH_3)_2]_2NH$, $[C_{14}H_{29}Si(CH_3)_2]_2NH$, $[C_{15}H_{31}Si(CH_3)_2]_2NH$, $[C_{16}H_{33}Si(CH_3)_2]_2NH$, $[C_{17}H_{35}Si(CH_3)_2]_2NH$, $[C_{18}H_{37}Si(CH_3)_2]_2NH$, $[(C_2H_5)_2Si(H)]_2NH$, $[C_2H_5Si(H)_2]_2NH$, $[C_2H_5Si(CH_3)(H)]_2NH$, $[(C_3H_7)_2Si(H)]_2NH$, $[C_3H_7Si(H)_2]_2NH$, $[CF_3CH_2CH_2Si(CH_3)_2]_2NH$, $[C_2F_5CH_2CH_2Si(CH_3)_2]_2NH$, $[C_3F_7CH_2CH_2Si(CH_3)_2]_2NH$, $[C_4F_9CH_2CH_2Si(CH_3)_2]_2NH$, $[C_5F_{11}CH_2CH_2Si(CH_3)_2]_2NH$, $[C_6F_{13}CH_2CH_2Si(CH_3)_2]_2NH$, $[C_7F_{15}CH_2CH_2Si(CH_3)_2]_2NH$, $[C_8F_{17}CH_2CH_2Si(CH_3)_2]_2NH$ and $[CF_3CH_2CH_2Si(CH_3)(H)]_2NH$. Among others, $[(CH_3)_3Si]_2NH$, $[C_2H_5Si(CH_3)_2]_2NH$, $[C_3H_7Si(CH_3)_2]_2NH$, $[C_4H_9Si(CH_3)_2]_2NH$ and $[CF_3CH_2CH_2Si(CH_3)_2]_2NH$ are preferred. Particularly preferred is $[(CH_3)_3Si]_2NH$.

Specific examples of the acidic compound of the general formula [6] include HCl, HBr, HI, $CF_3COOH$, $C_2F_5COOH$, $C_3F_7COOH$, $C_4F_9COOH$, $C_5F_{11}COOH$, $C_6F_{13}COOH$, $CF_3S(=O)_2OH$, $C_2F_5S(=O)_2OH$, $C_3F_7S(=O)_2OH$, $C_4F_9S(=O)_2OH$, $C_5F_{11}S(=O)_2OH$, $C_6F_{13}S(=O)_2OH$, $[CF_3S(=O)_2]_2NH$, $[C_2F_5S(=O)_2]_2NH$, $[C_3F_7S(=O)_2]_2NH$, $[C_4F_9S(=O)_2]_2NH$, $[C_5F_{11}S(=O)_2]_2NH$, $[C_6F_{13}S(=O)_2]_2NH$, $[CF_3S(=O)_2]_3CH$, $[C_2F_5S(=O)_2]_3CH$, $[C_3F_7S(=O)_2]_3CH$, $[C_4F_9S(=O)_2]_3CH$, $[C_5F_{11}S(=O)_2]_3CH$ and $[C_6F_{13}S(=O)_2]_3CH$. Among others, $CF_3COOH$, $C_2F_5COOH$, $C_3F_7COOH$, $C_4F_9COOH$ are preferred. Particularly preferred is $CF_3COOH$.

EXAMPLES

The present disclosure will be described in more detail below by way of the following experimental examples. It should however be understood that the present disclosure is not limited to these experimental examples.

A technique of forming an uneven pattern on a surface of a wafer and a technique of replacing a cleaning liquid retained at least in recess portions of an uneven pattern with another cleaning liquid have been variously studied as discussed in other literatures and have already been established. Accordingly, the water repellency imparting effect exerted by surface treatment of the wafer with the water-repellent protective film-forming liquid chemical was evaluated in the present disclosure. In the following experimental examples, water, which is known as a typical water-based cleaning liquid, was used as a liquid brought into contact with a surface of the wafer for contact angle evaluation.

In the case of a wafer having an unevenly patterned surface, however, it is not possible to exactly evaluate the angle of contact of water with a water-repellent protective film itself formed on the unevenly patterned surface of the wafer.

More specifically, the contact angle of a water drop is in general evaluated by dropping several microliters of water on a surface of a sample (substrate) and measuring an angle between the water drop and the substrate surface according to JIS R 3257 "Testing Method of Wettability of Glass Substrate Surface". In the case of the wafer having the unevenly patterned surface, the contact angle is enormously large. This is due to the Wenzel's effect or Cassie's effect by which the apparent contact angle of the water drop becomes increased under the influence of the surface shape (roughness) of the substrate on the contact angle.

In view of the above facts, the following experimental examples were each carried out by providing a wafer with a smooth surface, supplying the liquid chemical to the smooth surface of the wafer to form a protective film on the wafer surface, and then, making various evaluation operations on the assumption of the thus-formed protective film as a protective film formed on an unevenly patterned surface of a wafer. In each experimental example, a silicon wafer having a smooth surface coated with a $SiO_2$ layer, called a "$SiO_2$-coated wafer", was used as the wafer with the smooth surface.

The details of the respective experimental examples will be explained below. Hereinafter, the explanation will be given of a method for evaluation, a method for preparation of a water-repellent protective film-forming liquid chemical or raw chemical, a method of surface treatment of a wafer with the water-repellent protective film-forming liquid chemical, and results of evaluation.

[Method for Evaluation]

About 2 μl of pure water was placed on a surface of a wafer on which a protective film was formed. The angle between the water drop and the wafer surface (as a contact angle) was measured with a contact angle meter (manufactured by Kyowa Interface Science Co., Ltd.: CA-X Model). The contact angle was judged as being at a satisfactory level when it was 800 or larger.

Example 1-1

(1-1) Preparation of Water-Repellent Protective Film-Forming Liquid Chemical

A raw chemical was prepared in solution form by mixing trimethylsilyl trifluoroacetate (TMS-TFA: $(CH_3)_3Si-OC(=O)CF_3$) as a silicon compound component (II), 70 g of hexamethyldisilazane (HMDS: $(CH_3)_3Si-NH-Si(CH_3)_3$) as a silazane compound component (IV) and 915 g of propylene glycol monomethyl ether acetate (PGMEA) as an aprotic solvent component (III) together. Then, 3.6 g of water as a protic compound was added to the raw chemical so that the protic compound (water in liquid form) was brought into contact, in an amount of 0.2 mol per 1 kg of the total amount of the TMS-TFA, HMDS and PGMEA, with the raw chemical. There was thus prepared a water-repellent protective film-forming liquid chemical.

(2) Cleaning of Silicon Wafer

A silicon wafer with a smooth thermal oxide film (more specifically, a silicon wafer having on its surface a thermal oxide film of 1 μm thickness) was immersed in a 1 mass % aqueous solution of hydrogen fluoride for 10 minutes at room temperature, immersed in pure water for 1 minute at room temperature, and then, immersed in 2-propanol (iPA) for 1 minute at room temperature.

(3) Surface Treatment of Silicon Wafer with Protective Film-Forming Liquid Chemical The cleaned silicon wafer was immersed, at 25° C. for 30 seconds, in the water-repellent protective film forming-liquid chemical that had been prepared in the above section: "(1-1) Preparation of Water-Repellent Protective Film-Forming Liquid Chemical". After that, the silicon wafer was immersed in iPA for 30 seconds at room temperature. The silicon wafer was finally taken out from the iPA and dried by air blowing to remove the iPA from the surface of the silicon wafer.

This Example corresponds to the surface treatment of the wafer according to the method of the surface treatment mode 2. The evaluation of the surface-treated wafer was performed. As shown in TABLE 1, the initial contact angle of the wafer before the surface treatment was smaller than 10°; and the contact angle of the wafer after the surface treatment was 90°. It was confirmed that a good water repellency imparting effect was obtained in this Example.

TABLE 1

| | Raw Chemical Composition | | | | Protic Compound | | Protective Film-Forming Liquid Chemical (I) Aminosilane Compound * | |
|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Kind | Content Amount [mass %] |
| Ex. 1-1 | TMS-TFA | HMDS | PGMEA | — | Water | Addition | 0.2 | TMS-NH$_2$ | 0.15 |
| Ex. 1-2 | TMS-TFA | HMDS | PGMEA | — | Water | Addition | 0.05 | TMS-NH$_2$ | 0.12 |
| Ex. 1-3 | TMS-TFA | HMDS | PGMEA | — | Water | Addition | 0.01 | TMS-NH$_2$ | 0.06 |
| Ex. 1-4 | TMS-TFA | HMDS | PGMEA | — | iPA | Addition | 0.2 | TMS-NH$_2$ | 0.14 |
| Ex. 1-5 | TMS-TFA | HMDS | PGMEA | — | iPA | Addition | 0.05 | TMS-NH$_2$ | 0.11 |
| Ex. 1-6 | TMS-TFA | HMDS | PGMEA | — | iPA | Addition | 0.01 | TMS-NH$_2$ | 0.05 |
| Ex. 1-7 | TMS-TFA | HMDS | PGMEA | — | MeOH | Addition | 0.05 | TMS-NH$_2$ | 0.11 |
| Ex. 1-8 | TMS-TFA | HMDS | PGMEA | — | EtOH | Addition | 0.05 | TMS-NH$_2$ | 0.11 |
| Ex. 1-9 | TMS-TFA | HMDS | PGMEA | — | nBuOH | Addition | 0.05 | TMS-NH$_2$ | 0.11 |
| Ex. 1-10 | TMS-TFA | HMDS | PGMEA | — | PGME | Addition | 0.05 | TMS-NH$_2$ | 0.09 |
| Ex. 1-11 | TMS-TFA | HMDS | PGMEA | — | TFAcA | Addition | 0.05 | TMS-NH$_2$ | 0.07 |
| Ex. 1-12 | TMS-TFA | HMDS | PGMEA | — | Water | Addition | 0.05 | TMS-NH$_2$ | 0.12 |
| Ex. 1-13 | TMS-TFA | HMDS | PGMEA | — | Water | Addition | 0.05 | TMS-NH$_2$ | 0.12 |
| Ex. 1-14 | TMS-TFA | HMDS | PGMEA | — | iPA | Addition | 0.05 | TMS-NH$_2$ | 0.12 |
| Ex. 1-15 | TMS-TFA | HMDS | PGMEA | — | iPA | Addition | 0.05 | TMS-NH$_2$ | 0.12 |
| Ex. 1-16 | TMS-TFA | HMDS | PGMEA | — | Water | Addition | 0.05 | TMS-NH$_2$ | 0.12 |
| Ex. 1-17 | TMS-TFA | HMDS | PGMEA | — | Water | Addition | 0.05 | TMS-NH$_2$ | 0.12 |
| Ex. 1-18 | BDMS-TFA | DBTMDS | PGMEA | BDS-TFAcA | Water | Addition | 0.05 | BDMS-NH$_2$ | 0.18 |
| Ex. 1-19 | ODMS-TFA | DOTMDS | PGMEA | ODS-TFAcA | Water | Addition | 0.05 | ODMS-NH$_2$ | 0.25 |
| Ex. 1-20 | TMS-TFA | HMDS | PGMEA | — | Water | Gas Contact | 0.05 | TMS-NH$_2$ | 0.12 |
| Ex. 1-21 | TMS-TFA | HMDS | PGMEA | — | iPA | Gas Contact | 0.05 | TMS-NH$_2$ | 0.12 |
| Ex. 1-22 | TMS-TFA | HMDS | PGMEA | TMS-TFAcA | Water | Addition | 0.05 | TMS-NH$_2$ | 0.12 |
| Ex. 1-23 | TMS-TFA | HMDS | PGMEA | — | NH$_3$ | Gas Contact | 0.05 | TMS-NH$_2$ | 0.12 |
| Comp. Ex. 1-1 | TMS-TFA | HMDS | PGMEA | — | — | — | — | — | — |
| Comp. Ex. 1-2 | TMS-TFA | HMDS | PGMEA | — | Water | Addition | 0.4 | TMS-NH$_2$ | 0.005 |
| Comp. Ex. 1-3 | TMS-TFA | HMDS | PGMEA | — | iPA | Addition | 0.4 | TMS-NH$_2$ | 0.005 |

| | Protective Film-Forming Liquid Chemical | | | | | | Contact Angle [°] | |
|---|---|---|---|---|---|---|---|---|
| | (II) Silicon Compound | | (IV) Silazane Compound | | (III) Aprotic Solvent Kind | Other Silicon Compound Kind | Before Surface Treatment | After Surface Treatment |
| | Kind | Content Amount [mass %] | Kind | Content Amount [mass %] | | | | |
| Ex. 1-1 | TMS-TFA | 1.5 | HMDS | 3.8 | PGMEA | — | <10 | ○ (90) |
| Ex. 1-2 | TMS-TFA | 1.5 | HMDS | 6.2 | PGMEA | — | <10 | ○ (90) |
| Ex. 1-3 | TMS-TFA | 1.5 | HMDS | 6.8 | PGMEA | — | <10 | ○ (88) |
| Ex. 1-4 | TMS-TFA | 1.5 | HMDS | 3.8 | PGMEA | — | <10 | ○ (90) |
| Ex. 1-5 | TMS-TFA | 1.5 | HMDS | 6.2 | PGMEA | — | <10 | ○ (90) |
| Ex. 1-6 | TMS-TFA | 1.5 | HMDS | 6.8 | PGMEA | — | <10 | ○ (90) |
| Ex. 1-7 | TMS-TFA | 1.5 | HMDS | 6.8 | PGMEA | — | <10 | ○ (90) |
| Ex. 1-8 | TMS-TFA | 1.5 | HMDS | 6.8 | PGMEA | — | <10 | ○ (90) |
| Ex. 1-9 | TMS-TFA | 1.5 | HMDS | 6.8 | PGMEA | — | <10 | ○ (90) |
| Ex. 1-10 | TMS-TFA | 1.5 | HMDS | 6.8 | PGMEA | — | <10 | ○ (90) |
| Ex. 1-11 | TMS-TFA | 1.5 | HMDS | 6.8 | PGMEA | — | <10 | ○ (88) |
| Ex. 1-12 | TMS-TFA | 0.5 | HMDS | 6.8 | PGMEA | — | <10 | ○ (90) |

TABLE 1-continued

| | | | | | | | | |
|---|---|---|---|---|---|---|---|---|
| Ex. 1-13 | TMS-TFA | 0.2 | HMDS | 4.5 | PGMEA | — | <10 | ○ (90) |
| Ex. 1-14 | TMS-TFA | 0.2 | HMDS | 4.5 | PGMEA | — | <10 | ○ (90) |
| Ex. 1-15 | TMS-TFA | 0.03 | HMDS | 4.5 | PGMEA | — | <10 | ○ (86) |
| Ex. 1-16 | TMS-TFA | 5 | HMDS | 0.2 | PGMEA | — | <10 | ○ (90) |
| Ex. 1-17 | TMS-TFA | 10 | HMDS | 0.2 | PGMEA | — | <10 | ○ (90) |
| Ex. 1-18 | BDMS-TFA | 1.8 | DBTMDS | 5.8 | PGMEA | BDS-TFAcA | <10 | ○ (100) |
| Ex. 1-19 | ODMS-TFA | 2.3 | DOTMDS | 5.4 | PGMEA | ODS-TFAcA | <10 | ○ (104) |
| Ex. 1-20 | TMS-TFA | 1.5 | HMDS | 6.8 | PGMEA | — | <10 | ○ (90) |
| Ex. 1-21 | TMS-TFA | 1.5 | HMDS | 6.8 | PGMEA | — | <10 | ○ (90) |
| Ex. 1-22 | TMS-TFA | 1.5 | HMDS | 6.8 | PGMEA | TMS-TFAcA | <10 | ○ (90) |
| Ex. 1-23 | TMS-TFA | 1.5 | HMDS | 6.8 | PGMEA | — | <10 | ○ (90) |
| Comp. Ex. 1-1 | TMS-TFA | 1.5 | HMDS | 6.5 | PGMEA | — | <10 | x (76) |
| Comp. Ex. 1-2 | TMS-TFA | 1.5 | HMDS | 0.005 | PGMEA | — | <10 | x (78) |
| Comp. Ex. 1-3 | TMS-TFA | 1.5 | HMDS | 0.005 | PGMEA | — | <10 | x (78) |

* The content amount of the aminosilane compound is based on the total amount of the components (I) to (III).
The content amount of the other component is based on the total amount of the water-repellent protective film-forming liquid chemical.

Examples 1-2 to 1-23

The surface treatment of wafers was performed in the same manner as in Example 1-1, except for changing the kind, contact method and contact amount of the protic compound and the kinds and content amounts of the aminosilane compound, the silicon compound and the silazane compound. The evaluation of the surface-treated wafers was performed. The results are shown in TABLE 1.

In the table, the term "iPA" refers to 2-propanol; the term "MeOH" refers to methanol; the term "EtOH" refers to ethanol; the term "nBuOH" refers to 1-butanol; the term "PGME" refers to propylene glycol monomethyl ether; and the term "TFAcA" refers to trifluoroacetamide.

In Example 1-18, the raw chemical was prepared in solution form through the following reaction by mixing 86 g of dibutyltetramethyldisilazane (DBTMDS: $C_4H_9(CH_3)_2$Si—NH—Si$(CH_3)_2C_4H_9$) as the silazane compound, 900 g of PGMEA as the aprotic solvent and 14 g of trifluoroacetic anhydride together. Upon the mixing, the trifluoroacetic anhydride immediately reacted with the DBTMDS to form butyldimethylsilyl trifluoroacetate (BDMS-TFA: $C_4H_9(CH_3)_2$Si—OC(=O)$CF_3$) and butyldimethylsilyl trifluoroacetamide (BDS-TFAcA: $C_4H_9(CH_3)_2$Si—NH—C(=O)$CF_3$). In other words, the silicon and silazane compounds of this Example were of different kinds from those of the other Examples; and the BDS-TFAcA was contained as the other silicon compound in the raw chemical of this Example. The water-repellent protective film-forming liquid chemical was prepared by adding 0.9 g of water as the protic compound to the raw chemical and thereby bringing the protic compound (water in liquid form) into contact, in an amount of 0.05 mol per 1 kg of the total amount of the BDMS-TFA, DBTMDS and PGMEA, with the raw chemical.

In Example 1-19, the raw chemical was prepared in solution form through the following reaction by mixing 89 g of dioctyltetramethyldisilazane (DOTMDS: $C_8H_{17}(CH_3)_2$Si—NH—Si$(CH_3)_2CH_{17}$) as the silazane compound, 900 g of PGMEA as the aprotic solvent and 11 g of trifluoroacetic anhydride together. Upon the mixing, the trifluoroacetic anhydride immediately reacted with the DOTMDS to form octyldimethylsilyl trifluoroacetate (ODMS-TFA: $CH_{17}(CH_3)_2$Si—OC(=O)$CF_3$) and octyldimethylsilyl trifluoroacetamide (ODS-TFAcA: $CH_{17}(CH_3)_2$Si—NH—C(=O)$CF_3$). In other words, the silicon and silazane compounds of this Example were also of different kinds from those of the other Examples; and the ODS-TFAcA was contained as the other silicon compound in the raw chemical of this Example. The water-repellent protective film-forming liquid chemical was prepared by adding 0.9 g of water as the protic compound to the raw chemical and thereby bringing the protic compound (water in liquid form) into contact, in an amount of 0.05 mol per 1 kg of the total amount of the ODMS-TFA, DOTMDS and PGMEA, with the raw chemical.

In Example 1-22, the raw chemical was prepared in solution form through the following reaction by mixing 83 g of HMDS as the silazane compound, 900 g of PGMEA as therapeutic solvent and 17 g of trifluoroacetic anhydride together. Upon the mixing, the trifluoroacetic anhydride immediately reacted with the HMDS to form TMS-TFA and trimethylsilyl trifluoroacetamide (TMS-TFAcA: $(CH_3)_3$Si—NH—C(=O)$CF_3$. In other words, the TMS-TFAcA was contained as the other silicon compound in addition to the silicon and silazane compounds in the raw chemical of this Example.

In Examples 1-20, 1-21 and 1-23, the water-repellent protective film-forming liquid chemicals were each prepared by placing the raw chemical in a space in which the concentration of the protic amount had previously been controlled to be less than 0.001 mol relative to 1 kg of the total amount of the components (II), (III) and (IV), introducing a predetermined amount of the protic compound in gaseous form into the space and thereby bringing the raw chemical and the protic compound into contact with each other.

In each of these Examples, the initial contact angle of the wafer before the surface treatment was smaller than 10°; and the contact angle of the wafer after the surface treatment was 80° or greater. It was confirmed that a good water repellency imparting effect was obtained in each of these Examples.

Comparative Examples 1-1 to 1-3

The surface treatment of wafers was performed in the same manner as in Example 1-1, except for changing the kind and contact amount of the protic compound. The evaluation of the surface-treated wafers was performed. The n results are shown in TABLE 1. In each of these Comparative Examples, the contact angle of the wafer after the surface treatment was smaller than 80°. The water repellency imparting effect obtained was inferior to those in the corresponding Examples.

Figure 7:
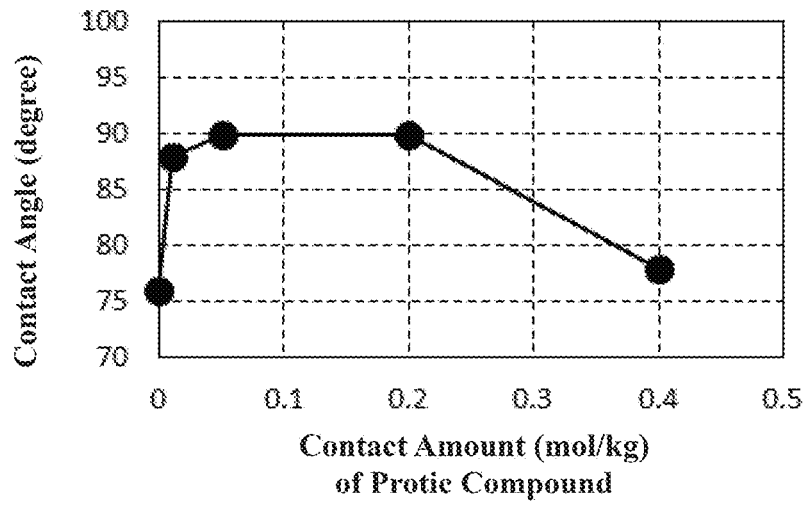
FIG. 7 is a plot of the contact angle after the surface treatment relative to the addition amount of water (Comparative Example 1-1, Example 1-3, Example 1-2, Example 1-1 and Comparative Example 1-2).
Figure 8:
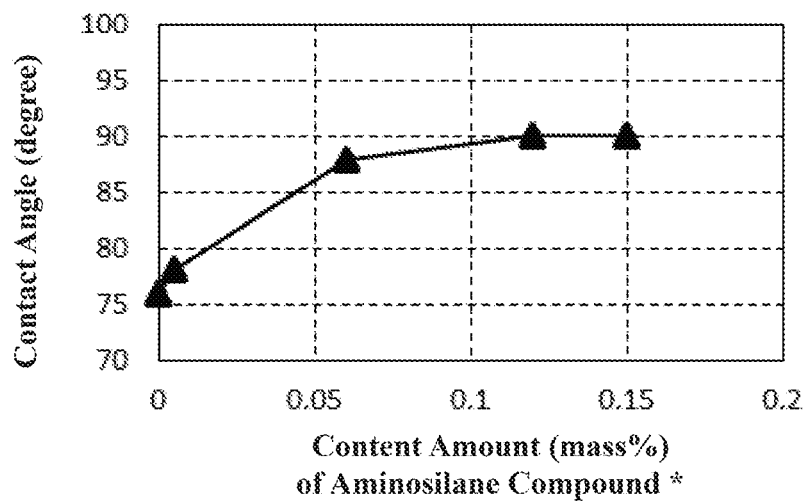
FIG. 8 is a plot of the contact angle after the surface treatment relative to the concentration of the aminosilane compound after the addition of water (Comparative Example 1-1, Comparative Example 1-2, Example 1-3, Example 1-2 and Example 1-1).

From the results of Examples 1-1 to 1-3 and Comparative Examples 1-1 and 1-2, a plot of the contact angle after the surface treatment relative to the contact amount of the protic compound (water in liquid form) is shown in FIG. 7; and a plot of the contact angle after the surface treatment relative to the content amount of the aminosilane compound (TMS-$NH_2$) as the component (I) in the total amount of the components (I) to (III) is shown in FIG. 8.

As shown in FIGS. 7 and 8, the content amount of the aminosilane compound (TMS-NH$_2$) as the component (I) was too small relative to the total amount of the components (I) to (III) (that is, the content amount of the component (I) was out of the range from 0.02 to 0.5 mass % based on the total amount of the components (I) to (III)) in Comparative Example 1-1 in which the protic compound (water in liquid form) was not contacted and in Comparative Example 1-2 in which the contact amount of the protic compound was too large. Consequently, the contact angle after the surface treatment was smaller than 800 in Comparative Examples 1-1 and 1-2. By contrast, the contact angle after the surface treatment exceeded 80° in Examples 1-1 to 1-3 using the water-repellent protective film-forming liquid chemicals in which the content amount of the component (I) was controlled to within the range of 0.02 to 0.5 mass % based on the total amount of the components (I) to (III) by contacting the protic compound (water in liquid form). In each of Examples 1-1 to 1-3, the water repellency imparting effect obtained was superior.

A similar tendency was seen even in the case where the kind of the protic compound was changed.

Figure 9:
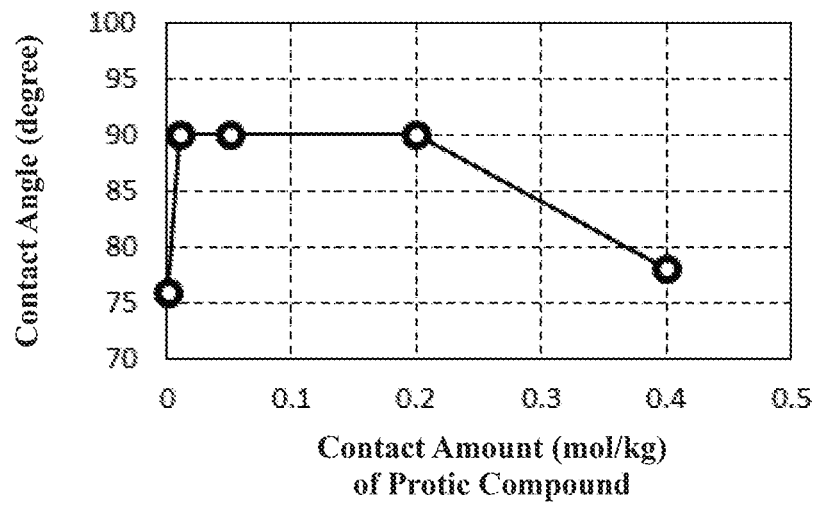
FIG. 9 is a plot of the contact angle after the surface treatment relative to the addition amount of iPA (Comparative Example 1-1, Example 1-6, Example 1-5, Example 1-4 and Comparative Example 1-3)
Figure 10:
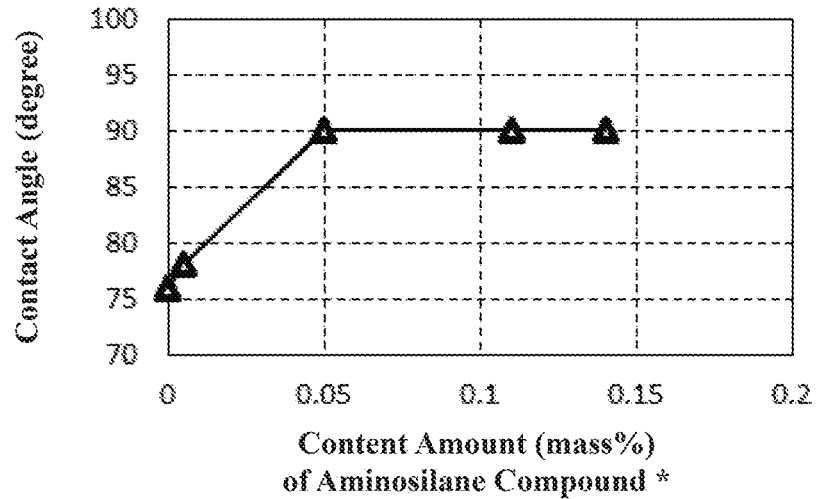
FIG. 10 is a plot of the contact angle after the surface treatment relative to the concentration of the aminosilane compound after the addition of iPA (Comparative Example 1-1, Comparative Example 1-3, Example 1-6, Example 1-5 and Example 1-4).

From the results of Examples 1-4 to 1-6 and Comparative Examples 1-1 and 1-3, a plot of the contact angle after the surface treatment relative to the contact amount of the protic compound (iPA in liquid form) is shown in FIG. 9; and a plot of the contact angle after the surface treatment relative to the content amount of the aminosilane compound (TMS-NH$_2$) as the component (I) in the total amount of the components (I) to (III) is shown in FIG. 10.

As shown in FIGS. 9 and 10, the content amount of the aminosilane compound (TMS-NH$_2$) as the component (I) was too small relative to the total amount of the components (I) to (III) (that is, the content amount of the component (I) was out of the range from 0.02 to 0.5 mass % based on the total amount of the components (I) to (III)) in Comparative Example 1-1 in which the protic compound (iPA in liquid form) was not contacted and in Comparative Example 1-3 in which the contact amount of the protic compound was too large. Consequently, the contact angle after the surface treatment was smaller than 800 in Comparative Examples 1-1 and 1-3. By contrast, the contact angle after the surface treatment exceeded 80° in Examples 1-4 to 1-6 using the water-repellent protective film-forming liquid chemicals in which the content amount of the component (I) was controlled to within the range of 0.02 to 0.5 mass % based on the total amount of the components (I) to (III) by contacting the protic compound (iPA in liquid form). In each of Examples 1-4 to 1-6, the water repellency imparting effect obtained was superior.

Example 2-1

(2-1) Preparation of Raw Chemical

A raw chemical was prepared in solution form by mixing 15 g of TMS-TFA as a silicon compound component (II), 70 g of HMDS as a silazane compound component (IV) and 915 g of PGMEA as an aprotic solvent component (III) together.

(2-2) Preparation of Water-Repellent Protective Film-Forming Liquid Chemical and Surface Treatment of Silicon Wafer with Protective Film-Forming Liquid Chemical A silicon wafer was cleaned in the same manner as in Example 1-1. The cleaned silicon wafer was immersed in the raw chemical that had been prepared in the above section: "(2-1) Preparation of Raw Chemical". Subsequently, 3.6 g of water in liquid form as a protic compound was added to the raw chemical so that the protic compound (water in liquid form) was brought into contact, in an amount of 0.2 mol per 1 kg of the total amount of the TMS-TFA, HMDS and PGMEA, with the raw chemical. There was thus prepared a water-repellent protective film-forming liquid chemical. The cleaned silicon wafer was immersed in the water-repellent protective film forming-liquid chemical for 30 seconds and then taken out. After that, the silicon wafer was immersed in iPA for 30 seconds at room temperature. The silicon wafer was finally taken out from the iPA and dried by air blowing to remove the iPA from the surface of the silicon wafer.

This Example corresponds to the surface treatment of the wafer according to the method of the surface treatment mode 3. The evaluation of the surface-treated wafer was performed. As shown in TABLE 2, the initial contact angle of the wafer before the surface treatment was smaller than 10°; and the contact angle of the wafer after the surface treatment was 90°. It was confirmed that a good water repellency imparting effect was obtained in this Example.

TABLE 2

| | Raw Chemical Composition | | | | Protic Compound | | | Protective Film-Forming Liquid Chemical (I) Aminosilane Compound * | |
|---|---|---|---|---|---|---|---|---|---|
| | (II) | (IV) | (III) | Other | | | | | |
| | Silicon Compound Kind | Silazane Compound Kind | Aprotic Solvent Kind | Silicon Compound Kind | Kind | Contact Method | Contact Amount [mol/kg] | Kind | Content Amount [mass %] |
| Ex. 2-1 | TMS-TFA | HMDS | PGMEA | — | Water | Addition | 0.2 | TMS-NH$_2$ | 0.15 |
| Ex. 2-2 | TMS-TFA | HMDS | PGMEA | — | Water | Addition | 0.05 | TMS-NH$_2$ | 0.12 |
| Ex. 2-3 | TMS-TFA | HMDS | PGMEA | — | Water | Addition | 0.01 | TMS-NH$_2$ | 0.06 |
| Ex. 2-4 | TMS-TFA | HMDS | PGMEA | — | iPA | Addition | 0.2 | TMS-NH$_2$ | 0.14 |
| Ex. 2-5 | TMS-TFA | HMDS | PGMEA | — | iPA | Addition | 0.05 | TMS-NH$_2$ | 0.11 |
| Ex. 2-6 | TMS-TFA | HMDS | PGMEA | — | iPA | Addition | 0.01 | TMS-NH$_2$ | 0.05 |
| Ex. 2-7 | TMS-TFA | HMDS | PGMEA | — | PGME | Addition | 0.05 | TMS-NH$_2$ | 0.09 |
| Ex. 2-8 | TMS-TFA | HMDS | PGMEA | — | Water | Addition | 0.05 | TMS-NH$_2$ | 0.12 |
| Ex. 2-9 | TMS-TFA | HMDS | PGMEA | — | Water | Addition | 0.05 | TMS-NH$_2$ | 0.12 |
| Ex. 2-10 | TMS-TFA | HMDS | PGMEA | — | Water | Addition | 0.05 | TMS-NH$_2$ | 0.12 |
| Ex. 2-11 | BDMS-TFA | DBTMDS | PGMEA | BDS-TFAcA | Water | Addition | 0.05 | BDMS-NH$_2$ | 0.18 |
| Ex. 2-12 | ODMS-TFA | DOTMDS | PGMEA | ODS-TFAcA | Water | Addition | 0.05 | ODMS-NH$_2$ | 0.25 |
| Ex. 2-13 | TMS-TFA | HMDS | PGMEA | — | Water | Gas Contact | 0.05 | TMS-NH$_2$ | 0.12 |
| Ex. 2-14 | TMS-TFA | HMDS | PGMEA | — | iPA | Gas Contact | 0.05 | TMS-NH$_2$ | 0.12 |

TABLE 2-continued

| | | | | | | | | | | |
|---|---|---|---|---|---|---|---|---|---|---|
| Ex. 2-15 | TMS-TFA | HMDS | PGMEA | TMS-TFAcA | Water | Addition | 0.05 | TMS-NH$_2$ | 0.12 | |
| Ex. 2-16 | TMS-TFA | HMDS | PGMEA | — | NH$_3$ | Gas Contact | 0.05 | TMS-NH$_2$ | 0.12 | |
| Comp. Ex. 2-1 | TMS-TFA | HMDS | PGMEA | — | — | — | — | — | — | |
| Camp. Ex. 2-2 | TMS-TFA | HMDS | PGMEA | — | Water | Addition | 0.4 | TMS-NH$_2$ | 0.005 | |
| Comp. Ex. 2-3 | TMS-TFA | HMDS | PGMEA | — | iPA | Addition | 0.4 | TMS-NH$_2$ | 0.005 | |

| | Protective Film-Forming Liquid Chemical | | | | | | | |
|---|---|---|---|---|---|---|---|---|
| | (II) Silicon Compound | | (IV) Silazane Compound | | (III) | | Contact Angle [°] | |
| | Kind | Content Amount [mass %] | Kind | Content Amount [mass %] | Aprotic Solvent Kind | Other Silicon Compound Kind | Before Surface Treatment | After Surface Treatment |
| Ex. 2-1 | TMS-TFA | 1.5 | HMDS | 3.8 | PGMEA | — | <10 | ○ (90) |
| Ex. 2-2 | TMS-TFA | 1.5 | HMDS | 6.2 | PGMEA | — | <10 | ○ (90) |
| Ex. 2-3 | TMS-TFA | 1.5 | HMDS | 6.8 | PGMEA | — | <10 | ○ (88) |
| Ex. 2-4 | TMS-TFA | 1.5 | HMDS | 3.8 | PGMEA | — | <10 | ○ (90) |
| Ex. 2-5 | TMS-TFA | 1.5 | HMDS | 6.2 | PGMEA | — | <10 | ○ (90) |
| Ex. 2-6 | TMS-TFA | 1.5 | HMDS | 6.8 | PGMEA | — | <10 | ○ (90) |
| Ex. 2-7 | TMS-TFA | 1.5 | HMDS | 6.8 | PGMEA | — | <10 | ○ (90) |
| Ex. 2-8 | TMS-TFA | 0.2 | HMDS | 4.5 | PGMEA | — | <10 | ○ (90) |
| Ex. 2-9 | TMS-TFA | 5 | HMDS | 0.2 | PGMEA | — | <10 | ○ (90) |
| Ex. 2-10 | TMS-TFA | 10 | HMDS | 0.2 | PGMEA | — | <10 | ○ (90) |
| Ex. 2-11 | BDMS-TFA | 1.8 | DBTMDS | 5.8 | PGMEA | BDS-TFAcA | <10 | ○ (100) |
| Ex. 2-12 | ODMS-TFA | 2.3 | DOTMDS | 5.4 | PGMEA | ODS-TFAcA | <10 | ○ (104) |
| Ex. 2-13 | TMS-TFA | 1.5 | HMDS | 6.8 | PGMEA | — | <10 | ○ (90) |
| Ex. 2-14 | TMS-TFA | 1.5 | HMDS | 6.8 | PGMEA | — | <10 | ○ (90) |
| Ex. 2-15 | TMS-TFA | 1.5 | HMDS | 6.8 | PGMEA | TMS-TFAcA | <10 | ○ (90) |
| Ex. 2-16 | TMS-TFA | 1.5 | HMDS | 6.8 | PGMEA | — | <10 | ○ (90) |
| Comp. Ex. 2-1 | TMS-TFA | 1.5 | HMDS | 6.5 | PGMEA | — | <10 | x (76) |
| Camp. Ex. 2-2 | TMS-TFA | 1.5 | HMDS | 0.005 | PGMEA | — | <10 | x (78) |
| Comp. Ex. 2-3 | TMS-TFA | 1.5 | HMDS | 0.005 | PGMEA | — | <10 | x (78) |

* The content amount of the aminosilane compound is based on the total amount of the components (I) to (III).
The content amount of the other component is based on the total amount of the water-repellent protective film-forming liquid chemical.

Examples 2-2 to 2-16

The surface treatment of wafers was performed in the same manner as in Example 2-1, except for changing the kind, contact method and contact amount of the protic compound and the kinds and content amounts of the aminosilane compound, the silicon compound and the silazane compound. The evaluation of the surface-treated wafers was performed. The results are shown in TABLE 2.

In Examples 2-13, 2-14 and 2-16, the water-repellent protective film-forming liquid chemicals were each prepared by, after cleaning the silicon wafer in the same manner as in Example 1-1, placing the cleaned silicon wafer in a space into which a predetermined amount of the protic compound in gaseous form had previously been introduced, and then, forming a puddle of the raw chemical on the surface (SiO$_2$ layer-side surface) of the silicon wafer.

In each of these Examples, the initial contact angle of the wafer before the surface treatment was smaller than 10°; and the contact angle of the wafer after the surface treatment was 800 or greater. It was confirmed that a good water repellency imparting effect was obtained in each of these Examples.

Comparative Examples 2-1 to 2-3

The surface treatment of wafers was performed in the same manner as in Example 2-1, except for changing the kind and contact amount of the protic compound. The evaluation of the surface-treated wafers was performed. The results are shown in TABLE 2. In each of these Comparative Examples, the contact angle of the wafer after the surface treatment was smaller than 80°. The water repellency imparting effect obtained was inferior to those in the corresponding Examples.

Example 3-1

A raw chemical was prepared in solution form by mixing 71 g of HMDS as a silazane compound component (IV) and 929 g of PGMEA as an aprotic solvent component (III). A water-repellent protective film-forming liquid chemical was prepared by adding 22.8 g of trifluoroacetic acid (TFA: CF$_3$COOH) as an acidic compound to the raw chemical and thereby bringing the acidic compound (TFA in liquid form) into contact, in an amount of 0.2 mol per 1 kg of the total amount of the HMDS and PGMEA, with the raw chemical. Using the prepared chemical liquid, the surface treatment of a wafer was performed in the same manner as in Example 1-1. The evaluation of the surface-treated wafer was performed. The results are shown in TABLE 3.

This Example corresponds to the surface treatment of the wafer according to the method of the surface treatment mode 4. As shown in TABLE 3, the initial contact angle of the wafer before the surface treatment was smaller than 10°; and the contact angle of the wafer after the surface treatment was 90°. It was confirmed that a good water repellency imparting effect was obtained in this Example.

TABLE 3

| | Raw Chemical Composition | | | | | | | Protective Film-Forming Liquid Chemical (I) Aminosilane Compound * | |
|---|---|---|---|---|---|---|---|---|---|
| | (II) Silicon Compound Kind | (IV) Silazane Compound Kind | (III) Aprotic Solvent Kind | Other Silicon Compound Kind | Acidic Compound Kind | Contact Method | Contact Amount [mol/kg] | Kind | Content Amount [mass %] |
| Ex. 3-1 | — | HMDS | PGMEA | — | TFA | Addition | 0.2 | TMS-NH$_2$ | 0.14 |
| Ex. 3-2 | — | HMDS | PGMEA | — | TFA | Addition | 0.05 | TMS-NH$_2$ | 0.11 |
| Ex. 3-3 | — | HMDS | PGMEA | — | TFA | Addition | 0.01 | TMS-NH$_2$ | 0.05 |
| Ex. 3-4 | — | DBTMDS | PGMEA | — | TFA | Addition | 0.05 | BDMS-NH$_2$ | 0.18 |
| Ex. 3-5 | — | DOTMDS | PGMEA | — | TFA | Addition | 0.05 | ODMS-NH$_2$ | 0.25 |
| Ex. 3-6 | — | HMDS | PGMEA | — | TFMSA | Addition | 0.05 | TMS-NH$_2$ | 0.11 |
| Comp. Ex. 3-1 | — | HMDS | PGMEA | — | — | — | — | — | — |
| Comp. Ex. 3-2 | — | HMDS | PGMEA | — | TFA | Addition | 0.4 | TMS-NH$_2$ | 0.005 |

| | Protective Film-Forming Liquid Chemical | | | | | | Contact Angle [°] | |
|---|---|---|---|---|---|---|---|---|
| | (II) Silicon Compound | | (IV) Silazane Compound | | (III) | Other | | |
| | Kind | Content Amount [mass %] | Kind | Content Amount [mass %] | Aprotic Solvent Kind | Silicon Compound Kind | Before Surface Treatment | After Surface Treatment |
| Ex. 3-1 | TMS-TFA | 3.7 | HMDS | 4 | PGMEA | — | <10 | ○ (90) |
| Ex. 3-2 | TMS-TFA | 0.9 | HMDS | 6.5 | PGMEA | — | <10 | ○ (90) |
| Ex. 3-3 | TMS-TFA | 0.2 | HMDS | 7 | PGMEA | — | <10 | ○ (88) |
| Ex. 3-4 | BDMS-TFA | 1.1 | DBTMDS | 6 | PGMEA | — | <10 | ○ (90) |
| Ex. 3-5 | ODMS-TFA | 1.4 | DOTMDS | 5.6 | PGMEA | — | <10 | ○ (90) |
| Ex. 3-6 | TMS-TFMSA | 1.1 | HMDS | 6.4 | PGMEA | — | <10 | ○ (90) |
| Comp. Ex. 3-1 | — | — | HMDS | 7 | PGMEA | — | <10 | x (16) |
| Comp. Ex. 3-2 | TMS-TFA | 7.4 | HMDS | 0.005 | PGMEA | — | <10 | x (78) |

* The content amount of the aminosilane compound is based on the total amount of the components (I) to (III).
The content amount of the other component is based on the total amount of the water-repellent protective film-forming liquid chemical.

Examples 3-2 to 3-6

The surface treatment of wafers was performed in the same manner as in Example 3-1, except for changing the kind and contact amount of the acidic compound and the kinds and content amounts of the aminosilane compound, the silicon compound and the silazane compound. The evaluation of the surface-treated wafers was performed. The results are shown in TABLE 3.

In the table, the term "TFMSA" refers to trifluoromethanesulfonic acid (CF$_3$SO$_3$H); and the term "TMS-TFMSA" refers to trimethylsilyl trifluoromethanesulfonate ((CH$_3$)$_3$Si—OS(=O)$_2$CF$_3$).

In each of these Examples, the initial contact angle of the wafer before the surface treatment was smaller than 10°; and the contact angle of the wafer after the surface treatment was 800 or greater. It was confirmed that a good water repellency imparting effect was obtained in each of these Examples.

Comparative Examples 3-1 and 3-2

The surface treatment of wafers was performed in the same manner as in Example 3-1, except for changing the contact amount of the acidic compound. The evaluation of the surface-treated wafers was performed. The results are shown in TABLE 3. In each of these Comparative Examples, the contact angle of the wafer after the surface treatment was smaller than 80°. The water repellency imparting effect obtained was inferior to those in the corresponding Examples.

Example 4-1

(4-1) Preparation of Raw Chemical

A raw chemical was prepared in solution form by mixing 71 g of HMDS as a silazane compound component (IV) and 929 g of PGMEA as an aprotic solvent component (III) together.

(4-2) Preparation of Water-Repellent Protective Film-Forming Liquid Chemical and Surface Treatment of Silicon Wafer with Protective Film-Forming Liquid Chemical.

A silicon wafer was cleaned in the same manner as in Example 1-1. The cleaned silicon wafer was immersed in the raw chemical that had been prepared in the above section: "(4-1) Preparation of Raw Chemical". Subsequently, 22.8 g of TFA in liquid form as an acidic compound was added to the raw chemical so that the acidic compound (TFA in liquid form) was brought into contact, in an amount of 0.2 mol per 1 kg of the total amount of the HMDS and PGMEA, with the raw chemical. There was thus prepared a water-repellent protective film-forming liquid chemical. The cleaned silicon wafer was immersed in the water-repellent protective film forming-liquid chemical for 30 seconds and then taken out. After that, the silicon wafer was immersed in iPA for 30 seconds at room temperature. The silicon wafer was finally taken out from the iPA and dried by air blowing to remove the iPA from the surface of the silicon wafer.

This Example corresponds to the surface treatment of the wafer according to the method of the surface treatment mode 5. The evaluation of the surface-treated wafer was performed. As shown in TABLE 4, the initial contact angle of the wafer before the surface treatment was smaller than 10°; and the contact angle of the wafer after the surface treatment was 90°. It was confirmed that a good water repellency imparting effect was obtained in this Example.

the contact angle of the wafer after the surface treatment was smaller than 80°. The water repellency imparting effect obtained was inferior to those in the corresponding Examples.

TABLE 4

| | Raw Chemical Composition | | | | Acidic Compound | | | Protective Film-Forming Liquid Chemical (I) Aminosilane Compound * | |
|---|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Kind | Content Amount [mass %] |
| Ex. 4-1 | — | HMDS | PGMEA | — | TFA | Addition | 0.2 | TMS-$NH_2$ | 0.14 |
| Ex. 4-2 | — | HMDS | PGMEA | — | TFA | Addition | 0.05 | TMS-$NH_2$ | 0.11 |
| Ex. 4-3 | — | HMDS | PGMEA | — | TFA | Addition | 0.01 | TMS-$NH_2$ | 0.05 |
| Ex. 4-4 | — | DBTMDS | PGMEA | — | TFA | Addition | 0.05 | BDMS-$NH_2$ | 0.18 |
| Ex. 4-5 | — | DOTMDS | PGMEA | — | TFA | Addition | 0.05 | ODMS-$NH_2$ | 0.25 |
| Ex. 4-6 | — | HMDS | PGMEA | — | TFMSA | Addition | 0.05 | TMS-$NH_2$ | 0.11 |
| Comp. Ex. 4-1 | — | HMDS | PGMEA | — | — | — | — | — | — |
| Comp. Ex. 4-2 | — | HMDS | PGMEA | — | TFA | Addition | 0.4 | TMS-$NH_2$ | 0.005 |

| | Protective Film-Forming Liquid Chemical | | | | | | | |
|---|---|---|---|---|---|---|---|---|
| | (II) Silicon Compound | | (IV) Silazane Compound | | (III) Aprotic Solvent Kind | Other Silicon Compound Kind | Contact Angle [°] | |
| | Kind | Content Amount [mass %] | Kind | Content Amount [mass %] | | | Before Surface Treatment | After Surface Treatment |
| Ex. 4-1 | TMS-TFA | 3.7 | HMDS | 4 | PGMEA | — | <10 | ○ (90) |
| Ex. 4-2 | TMS-TFA | 0.9 | HMDS | 6.5 | PGMEA | — | <10 | ○ (88) |
| Ex. 4-3 | TMS-TFA | 0.2 | HMDS | 7 | PGMEA | — | <10 | ○ (86) |
| Ex. 4-4 | BDMS-TFA | 1.1 | DBTMDS | 6 | PGMEA | — | <10 | ○ (90) |
| Ex. 4-5 | ODMS-TFA | 1.4 | DOTMDS | 5.6 | PGMEA | — | <10 | ○ (90) |
| Ex. 4-6 | TMS-TFMSA | 1.1 | HMDS | 6.4 | PGMEA | — | <10 | ○ (90) |
| Comp. Ex. 4-1 | — | — | HMDS | 7 | PGMEA | — | <10 | x (16) |
| Comp. Ex. 4-2 | TMS-TFA | 7.4 | HMDS | 0.005 | PGMEA | — | <10 | x (78) |

* The content amount of the aminosilane compound is based on the total amount of the components (I) to (III).
The content amount of the other component is based on the total amount of the water-repellent protective film-forming liquid chemical.

Examples 4-2 to 4-6

The surface treatment of wafers was performed in the same manner as in Example 4-1, except for changing the kind and contact amount of the acidic compound and the kinds and content amounts of the aminosilane compound, the silicon compound and the silazane compound. The evaluation of the surface-treated wafers was performed. The results are shown in TABLE 4.

In each of these Examples, the initial contact angle of the wafer before the surface treatment was smaller than 10°; and the contact angle of the wafer after the surface treatment was 800 or greater. It was confirmed that a good water repellency imparting effect was obtained in each of these Examples.

Comparative Examples 4-1 and 4-2

The surface treatment of wafers was performed in the same manner as in Example 4-1, except for changing the contact amount of the acidic compound. The evaluation of the surface-treated wafers was performed. The results are shown in TABLE 4. In each of these Comparative Examples, As described above, the adoption of the water-repellent protective film-forming liquid chemical and the wafer surface treatment method according to the present disclosure leads to a further improvement of the water repellency imparting effect as compared to those of conventional ones even in the case where the surface treatment mode is varied.

Example 1-1a

The same surface treatment operation as in Example 1-1 was performed except that water as the protic compound was added, in a state of being diluted with (if not compatible, dispersed in) an aprotic solvent PBMEA, to the raw chemical in the above section: "Preparation of Water-Repellent Protective Film-Forming Liquid Chemical". The evaluation was performed in the same manner as above. Herein, the addition amount of the water was controlled to 0.2 mol per 1 kg of the total amount of the TMS-TFA, the HMDS, the PGMEA contained in the raw chemical and the PGMEA used for dilution of the protic compound. The results are shown in TABLE 5. The amount of the PGMEA used for dilution of the protic compound and the amount of the PGMEA contained in the raw chemical were set to the same as each other.

TABLE 5

| | Raw Chemical Composition | | | | Protic Compound (added in diluted form with PGMEA) | | | Protective Film-Forming Liquid Chemical (I) Aminosilane Compound * | |
|---|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Kind | Content Amount [mass %] |
| Ex. 1-1a | TMS-TFA | HMDS | PGMEA | — | Water | Addition | 0.2 | TMS-NH$_2$ | 0.15 |
| Ex. 1-2a | TMS-TFA | HMDS | PGMEA | — | Water | Addition | 0.05 | TMS-NH$_2$ | 0.12 |
| Ex. 1-3a | TMS-TFA | HMDS | PGMEA | — | Water | Addition | 0.01 | TMS-NH$_2$ | 0.06 |
| Ex. 1-4a | TMS-TFA | HMDS | PGMEA | — | iPA | Addition | 0.2 | TMS-NH$_2$ | 0.14 |
| Ex. 1-5a | TMS-TFA | HMDS | PGMEA | — | iPA | Addition | 0.05 | TMS-NH$_2$ | 0.11 |
| Ex. 1-6a | TMS-TFA | HMDS | PGMEA | — | iPA | Addition | 0.01 | TMS-NH$_2$ | 0.05 |
| Ex. 1-7a | TMS-TFA | HMDS | PGMEA | — | MeOH | Addition | 0.05 | TMS-NH$_2$ | 0.11 |
| Ex. 1-8a | TMS-TFA | HMDS | PGMEA | — | EtOH | Addition | 0.05 | TMS-NH$_2$ | 0.11 |
| Ex. 1-9a | TMS-TFA | HMDS | PGMEA | — | nBuOH | Addition | 0.05 | TMS-NH$_2$ | 0.11 |
| Ex. 1-10a | TMS-TFA | HMDS | PGMEA | — | PGME | Addition | 0.05 | TMS-NH$_2$ | 0.09 |
| Ex. 1-11a | TMS-TFA | HMDS | PGMEA | — | TFAcA | Addition | 0.05 | TMS-NH$_2$ | 0.07 |
| Ex. 1-12a | TMS-TFA | HMDS | PGMEA | — | Water | Addition | 0.05 | TMS-NH$_2$ | 0.12 |
| Ex. 1-13a | TMS-TFA | HMDS | PGMEA | — | Water | Addition | 0.05 | TMS-NH$_2$ | 0.12 |
| Ex. 1-14a | TMS-TFA | HMDS | PGMEA | — | iPA | Addition | 0.05 | TMS-NH$_2$ | 0.12 |
| Ex. 1-15a | TMS-TFA | HMDS | PGMEA | — | iPA | Addition | 0.05 | TMS-NH$_2$ | 0.12 |
| Ex. 1-16a | TMS-TFA | HMDS | PGMEA | — | Water | Addition | 0.05 | TMS-NH$_2$ | 0.12 |
| Ex. 1-17a | TMS-TFA | HMDS | PGMEA | — | Water | Addition | 0.05 | TMS-NH$_2$ | 0.12 |
| Ex. 1-18a | BDMS-TFA | DBTMDS | PGMEA | BDS-TFAcA | Water | Addition | 0.05 | BDMS-NH$_2$ | 0.18 |
| Ex. 1-19a | ODMS-TFA | DOTMDS | PGMEA | ODS-TFAcA | Water | Addition | 0.05 | ODMS-NH$_2$ | 0.25 |
| Ex. 1-20a | TMS-TFA | HMDS | PGMEA | — | Water | Gas Contact | 0.05 | TMS-NH$_2$ | 0.12 |
| Ex. 1-21a | TMS-TFA | HMDS | PGMEA | — | iPA | Gas Contact | 0.05 | TMS-NH$_2$ | 0.12 |
| Ex. 1-22a | TMS-TFA | HMDS | PGMEA | TMS-TFAcA | Water | Addition | 0.05 | TMS-NH$_2$ | 0.12 |
| Comp. Ex. 1-1 | TMS-TFA | HMDS | PGMEA | — | — | — | — | — | — |
| Comp. Ex. 1-2a | TMS-TFA | HMDS | PGMEA | — | Water | Addition | 0.4 | TMS-NH$_2$ | 0.005 |
| Comp. Ex. 1-3a | TMS-TFA | HMDS | PGMEA | — | iPA | Addition | 0.4 | TMS-NH$_2$ | 0.005 |

| | Protective Film-Forming Liquid Chemical | | | | | | Contact Angle [°] | |
|---|---|---|---|---|---|---|---|---|
| | (II) Silicon Compound | | (IV) Silazane Compound | | (III) Aprotic Solvent Kind | Other Silicon Compound Kind | Before Surface Treatment | After Surface Treatment |
| | Kind | Content Amount [mass %] | Kind | Content Amount [mass %] | | | | |
| Ex. 1-1a | TMS-TFA | 1.5 | HMDS | 3.8 | PGMEA | — | <10 | ○ (90) |
| Ex. 1-2a | TMS-TFA | 1.5 | HMDS | 6.2 | PGMEA | — | <10 | ○ (90) |
| Ex. 1-3a | TMS-TFA | 1.5 | HMDS | 6.8 | PGMEA | — | <10 | ○ (88) |
| Ex. 1-4a | TMS-TFA | 1.5 | HMDS | 3.8 | PGMEA | — | <10 | ○ (90) |
| Ex. 1-5a | TMS-TFA | 1.5 | HMDS | 6.2 | PGMEA | — | <10 | ○ (90) |
| Ex. 1-6a | TMS-TFA | 1.5 | HMDS | 6.8 | PGMEA | — | <10 | ○ (90) |
| Ex. 1-7a | TMS-TFA | 1.5 | HMDS | 6.8 | PGMEA | — | <10 | ○ (90) |
| Ex. 1-8a | TMS-TFA | 1.5 | HMDS | 6.8 | PGMEA | — | <10 | ○ (90) |
| Ex. 1-9a | TMS-TFA | 1.5 | HMDS | 6.8 | PGMEA | — | <10 | ○ (90) |
| Ex. 1-10a | TMS-TFA | 1.5 | HMDS | 6.8 | PGMEA | — | <10 | ○ (90) |
| Ex. 1-11a | TMS-TFA | 1.5 | HMDS | 6.8 | PGMEA | — | <10 | ○ (88) |
| Ex. 1-12a | TMS-TFA | 0.5 | HMDS | 6.8 | PGMEA | — | <10 | ○ (90) |
| Ex. 1-13a | TMS-TFA | 0.2 | HMDS | 4.5 | PGMEA | — | <10 | ○ (90) |
| Ex. 1-14a | TMS-TFA | 0.2 | HMDS | 4.5 | PGMEA | — | <10 | ○ (90) |
| Ex. 1-15a | TMS-TFA | 0.03 | HMDS | 4.5 | PGMEA | — | <10 | ○ (86) |
| Ex. 1-16a | TMS-TFA | 5 | HMDS | 0.2 | PGMEA | — | <10 | ○ (90) |
| Ex. 1-17a | TMS-TFA | 10 | HMDS | 0.2 | PGMEA | — | <10 | ○ (90) |
| Ex. 1-18a | BDMS-TFA | 1.8 | DBTMDS | 5.8 | PGMEA | BDS-TFAcA | <10 | ○ (100) |
| Ex. 1-19a | ODMS-TFA | 2.3 | DOTMDS | 5.4 | PGMEA | ODS-TFAcA | <10 | ○ (104) |
| Ex. 1-20a | TMS-TFA | 1.5 | HMDS | 6.8 | PGMEA | — | <10 | ○ (90) |
| Ex. 1-21a | TMS-TFA | 1.5 | HMDS | 6.8 | PGMEA | — | <10 | ○ (90) |
| Ex. 1-22a | TMS-TFA | 1.5 | HMDS | 6.8 | PGMEA | TMS-TFAcA | <10 | ○ (90) |
| Comp. Ex. 1-1 | TMS-TFA | 1.5 | HMDS | 6.5 | PGMEA | — | <10 | x (76) |
| Comp. Ex. 1-2a | TMS-TFA | 1.5 | HMDS | 0.005 | PGMEA | — | <10 | x (78) |
| Comp. Ex. 1-3a | TMS-TFA | 1.5 | HMDS | 0.005 | PGMEA | — | <10 | x (78) |

* The content amount of the aminosilane compound is based on the total amount of the components (I) to (III).
The content amount of the other component is based on the total amount of the water-repellent protective film-forming liquid chemical.

Examples 1-2a to 1-22a and Comparative Examples 1-2a to 1-3a

The surface treatment of wafers was performed in the same manner as in Example 1-1a, except for changing the kind, contact method and contact amount of the protic compound and the kinds and content amounts of the aminosilane compound, the silicon compound and the silazane compound. The evaluation of the surface-treated wafers was performed. In each of Examples 1-20a and 1-21a, the protic compound in gaseous form was, in a state of being diluted with the aprotic solvent in gaseous form, brought into contact with the raw chemical. The results are shown in TABLE 5. As the results of the corresponding comparative example in which no protic compound was contacted, the results of Comparative Example 1-1 are also shown in the table.

Example 2-1a

The same surface treatment operation as in Example 2-1 was performed except that water as the protic compound was added, in a state of being diluted with (if not compatible, dispersed in) an aprotic solvent PBMEA, to the raw chemical in the above section: "Preparation of Water-Repellent Protective Film-Forming Liquid Chemical and Surface Treatment of Silicon Wafer with Protective Film-Forming Liquid Chemical". The evaluation was performed in the same manner as above. Herein, the addition amount of the water was controlled to 0.2 mol per 1 kg of the total amount of the TMS-TFA, the HMDS, the PGMEA contained in the raw chemical and the PGMEA used for dilution of the protic compound. The results are shown in TABLE 6. The amount of the PGMEA used for dilution of the protic compound and the amount of the PGMEA contained in the raw chemical were set to the same as each other.

TABLE 6

| | Raw Chemical Composition | | | | Protic Compound (added in diluted form with PGMEA) | | | Protective Film-Forming Liquid Chemical (I) Aminosilane Compound * | |
|---|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Kind | Content Amount [mass %] |
| Ex. 2-1a | TMS-TFA | HMDS | PGMEA | — | Water | Addition | 0.2 | TMS-NH$_2$ | 0.15 |
| Ex. 2-2a | TMS-TFA | HMDS | PGMEA | — | Water | Addition | 0.05 | TMS-NH$_2$ | 0.12 |
| Ex. 2-3a | TMS-TFA | HMDS | PGMEA | — | Water | Addition | 0.01 | TMS-NH$_2$ | 0.06 |
| Ex. 2-4a | TMS-TFA | HMDS | PGMEA | — | iPA | Addition | 0.2 | TMS-NH$_2$ | 0.14 |
| Ex. 2-5a | TMS-TFA | HMDS | PGMEA | — | iPA | Addition | 0.05 | TMS-NH$_2$ | 0.11 |
| Ex. 2-6a | TMS-TFA | HMDS | PGMEA | — | iPA | Addition | 0.01 | TMS-NH$_2$ | 0.05 |
| Ex. 2-7a | TMS-TFA | HMDS | PGMEA | — | PGME | Addition | 0.05 | TMS-NH$_2$ | 0.09 |
| Ex. 2-8a | TMS-TFA | HMDS | PGMEA | — | Water | Addition | 0.05 | TMS-NH$_2$ | 0.12 |
| Ex. 2-9a | TMS-TFA | HMDS | PGMEA | — | Water | Addition | 0.05 | TMS-NH$_2$ | 0.12 |
| Ex. 2-10a | TMS-TFA | HMDS | PGMEA | — | Water | Addition | 0.05 | TMS-NH$_2$ | 0.12 |
| Ex. 2-11a | BDMS-TFA | DBTMDS | PGMEA | BDS-TFAcA | Water | Addition | 0.05 | BDMS-NH$_2$ | 0.18 |
| Ex. 2-12a | ODMS-TFA | DOTMDS | PGMEA | ODS-TFAcA | Water | Addition | 0.05 | ODMS-NH$_2$ | 0.25 |
| Ex. 2-13a | TMS-TFA | HMDS | PGMEA | — | Water | Gas Contact | 0.05 | TMS-NH$_2$ | 0.12 |
| Ex. 2-14a | TMS-TFA | HMDS | PGMEA | — | iPA | Gas Contact | 0.05 | TMS-NH$_2$ | 0.12 |
| Ex. 2-15a | TMS-TFA | HMDS | PGMEA | TMS-TFAcA | Water | Addition | 0.05 | TMS-NH$_2$ | 0.12 |
| Comp. Ex. 2-1 | TMS-TFA | HMDS | PGMEA | — | — | — | — | — | — |
| Comp. Ex. 2-2a | TMS-TFA | HMDS | PGMEA | — | Water | Addition | 0.4 | TMS-NH$_2$ | 0.005 |
| Comp. Ex. 2-3a | TMS-TFA | HMDS | PGMEA | — | iPA | Addition | 0.4 | TMS-NH$_2$ | 0.005 |

| | Protective Film-Forming Liquid Chemical | | | | | | Contact Angle [°] | |
|---|---|---|---|---|---|---|---|---|
| | (II) Silicon Compound | | (IV) Silazane Compound | | (III) Aprotic Solvent Kind | Other Silicon Compound Kind | Before Surface Treatment | After Surface Treatment |
| | Kind | Content Amount [mass %] | Kind | Content Amount [mass %] | | | | |
| Ex. 2-1a | TMS-TFA | 1.5 | HMDS | 3.8 | PGMEA | — | <10 | ∘ (90) |
| Ex. 2-2a | TMS-TFA | 1.5 | HMDS | 6.2 | PGMEA | — | <10 | ∘ (90) |
| Ex. 2-3a | TMS-TFA | 1.5 | HMDS | 6.8 | PGMEA | — | <10 | ∘ (88) |
| Ex. 2-4a | TMS-TFA | 1.5 | HMDS | 3.8 | PGMEA | — | <10 | ∘ (90) |
| Ex. 2-5a | TMS-TFA | 1.5 | HMDS | 6.2 | PGMEA | — | <10 | ∘ (90) |
| Ex. 2-6a | TMS-TFA | 1.5 | HMDS | 6.8 | PGMEA | — | <10 | ∘ (90) |
| Ex. 2-7a | TMS-TFA | 1.5 | HMDS | 6.8 | PGMEA | — | <10 | ∘ (90) |
| Ex. 2-8a | TMS-TFA | 0.2 | HMDS | 4.5 | PGMEA | — | <10 | ∘ (90) |
| Ex. 2-9a | TMS-TFA | 5 | HMDS | 0.2 | PGMEA | — | <10 | ∘ (90) |
| Ex. 2-10a | TMS-TFA | 10 | HMDS | 0.2 | PGMEA | — | <10 | ∘ (90) |
| Ex. 2-11a | BDMS-TFA | 1.8 | DBTMDS | 5.8 | PGMEA | BDS-TFAcA | <10 | ∘ (100) |
| Ex. 2-12a | ODMS-TFA | 2.3 | DOTMDS | 5.4 | PGMEA | ODS-TFAcA | <10 | ∘ (104) |
| Ex. 2-13a | TMS-TFA | 1.5 | HMDS | 6.8 | PGMEA | — | <10 | ∘ (90) |
| Ex. 2-14a | TMS-TFA | 1.5 | HMDS | 6.8 | PGMEA | — | <10 | ∘ (90) |
| Ex. 2-15a | TMS-TFA | 1.5 | HMDS | 6.8 | PGMEA | TMS-TFAcA | <10 | ∘ (90) |

TABLE 6-continued

| | | | | | | | | |
|---|---|---|---|---|---|---|---|---|
| Comp. Ex. 2-1 | TMS-TFA | 1.5 | HMDS | 6.5 | PGMEA | — | <10 | x (76) |
| Comp. Ex. 2-2a | TMS-TFA | 1.5 | HMDS | 0.005 | PGMEA | — | <10 | x (78) |
| Comp. Ex. 2-3a | TMS-TFA | 1.5 | HMDS | 0.005 | PGMEA | — | <10 | x (78) |

\* The content amount of the aminosilane compound is based on the total amount of the components (I) to (III).
The content amount of the other component is based on the total amount of the water-repellent protective film-forming liquid chemical.

Examples 2-2a to 2-15a and Comparative Examples 2-2a to 2-3a

The surface treatment of wafers was performed in the same manner as in Example 2-1a, except for changing the kind, contact method and contact amount of the protic compound and the kinds and content amounts of the aminosilane compound, the silicon compound and the silazane compound. The evaluation of the surface-treated wafers was performed. In each of Examples 2-13a and 2-14a, the protic compound in gaseous form was, in a state of being diluted with the aprotic solvent in gaseous form, brought into contact with the raw chemical. The results are shown in TABLE 6. As the results of the corresponding comparative example in which no protic compound was contacted, the results of Comparative Example 2-1 are also shown in the table.

Example 3-1a

The same surface treatment operation as in Example 3-1 was performed except that TFA as the acidic compound was added, in a state of being diluted with (if not compatible, dispersed in) an aprotic solvent PBMEA, to the raw chemical in the above section: "Preparation of Water-Repellent Protective Film-Forming Liquid Chemical". The evaluation was performed in the same manner as above. Herein, the addition amount of the TFA was controlled to 0.2 mol per 1 kg of the total amount of the HMDS, the PGMEA contained in the raw chemical and the PGMEA used for dilution of the acidic compound. The results are shown in TABLE 7. The amount of the PGMEA used for dilution of the acidic compound and the amount of the PGMEA contained in the raw chemical were set to the same as each other.

TABLE 7

| | Raw Chemical Composition | | | | Acidic Compound (added in diluted form with PGMEA) | | | Protective Film-Forming Liquid Chemical (I) Aminosilane Compound * | |
|---|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Kind | Content Amount [mass %] |
| Ex. 3-1a | — | HMDS | PGMEA | — | TFA | Addition | 0.2 | TMS-$NH_2$ | 0.14 |
| Ex. 3-2a | — | HMDS | PGMEA | — | TFA | Addition | 0.05 | TMS-$NH_2$ | 0.11 |
| Ex. 3-3a | — | HMDS | PGMEA | — | TFA | Addition | 0.01 | TMS-$NH_2$ | 0.05 |
| Ex. 3-4a | — | DBTMDS | PGMEA | — | TFA | Addition | 0.05 | BDMS-$NH_2$ | 0.18 |
| Ex. 3-5a | — | DOTMDS | PGMEA | — | TFA | Addition | 0.05 | ODMS-$NH_2$ | 0.25 |
| Ex. 3-6a | — | HMDS | PGMEA | — | TFMSA | Addition | 0.05 | TMS-$NH_2$ | 0.11 |
| Comp. Ex. 3-1 | — | HMDS | PGMEA | — | — | — | — | — | — |
| Comp. Ex. 3-2a | — | HMDS | PGMEA | — | TFA | Addition | 0.4 | TMS-$NH_2$ | 0.005 |

| | Protective Film-Forming Liquid Chemical | | | | | | Contact Angle [°] | |
|---|---|---|---|---|---|---|---|---|
| | (II) Silicon Compound | | (IV) Silazane Compound | | (III) Aprotic Solvent Kind | Other Silicon Compound Kind | Before Surface Treatment | After Surface Treatment |
| | Kind | Content Amount [mass %] | Kind | Content Amount [mass %] | | | | |
| Ex. 3-1a | TMS-TFA | 3.7 | HMDS | 4 | PGMEA | — | <10 | o (90) |
| Ex. 3-2a | TMS-TFA | 0.9 | HMDS | 6.5 | PGMEA | — | <10 | o (90) |
| Ex. 3-3a | TMS-TFA | 0.2 | HMDS | 7 | PGMEA | — | <10 | o (88) |
| Ex. 3-4a | BDMS-TFA | 1.1 | DBTMDS | 6 | PGMEA | — | <10 | o (90) |
| Ex. 3-5a | ODMS-TFA | 1.4 | DOTMDS | 5.6 | PGMEA | — | <10 | o (90) |
| Ex. 3-6a | TMS-TFMSA | 1.1 | HMDS | 6.4 | PGMEA | — | <10 | o (90) |
| Comp. Ex. 3-1 | — | — | HMDS | 7 | PGMEA | — | <10 | x (16) |
| Comp. Ex. 3-2a | TMS-TFA | 7.4 | HMDS | 0.005 | PGMEA | — | <10 | x (78) |

\* The content amount of the aminosilane compound is based on the total amount of the components (I) to (III).
The content amount of the other component is based on the total amount of the water-repellent protective film-forming liquid chemical.

Examples 3-2a to 3-6 and Comparative Example 3-2a

The surface treatment of wafers was performed in the same manner as in Example 3-1a, except for changing the kind and contact amount of the acidic compound and the of the HMDS, the PGMEA contained in the raw chemical and the PGMEA used for dilution of the acidic compound. The results are shown in TABLE 8. The amount of the PGMEA used for dilution of the acidic compound and the amount of the PGMEA contained in the raw chemical were the same as each other.

TABLE 8

| | Raw Chemical Composition | | | | Acidic Compound (added in diluted form with PGMEA) | | | Protective Film-Forming Liquid Chemical (I) Aminosilane Compound * | |
|---|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Kind | Content Amount [mass %] |
| Ex. 4-1a | — | HMDS | PGMEA | — | TFA | Addition | 0.2 | TMS-$NH_2$ | 0.14 |
| Ex. 4-2a | — | HMDS | PGMEA | — | TFA | Addition | 0.05 | TMS-$NH_2$ | 0.11 |
| Ex. 4-3a | — | HMDS | PGMEA | — | TFA | Addition | 0.01 | TMS-$NH_2$ | 0.05 |
| Ex. 4-4a | — | DBTMDS | PGMEA | — | TFA | Addition | 0.05 | BDMS-$NH_2$ | 0.18 |
| Ex. 4-5a | — | DOTMDS | PGMEA | — | TFA | Addition | 0.05 | ODMS-$NH_2$ | 0.25 |
| Ex. 4-6a | — | HMDS | PGMEA | — | TFMSA | Addition | 0.05 | TMS-$NH_2$ | 0.11 |
| Comp. Ex. 4-1 | — | HMDS | PGMEA | — | — | — | — | — | — |
| Comp. Ex. 4-2a | — | HMDS | PGMEA | — | TFA | Addition | 0.4 | TMS-$NH_2$ | 0.005 |

| | Protective Film-Forming Liquid Chemical | | | | | | Contact Angle [°] | |
|---|---|---|---|---|---|---|---|---|
| | (II) Silicon Compound | | (IV) Silazane Compound | | (III) | Other | | |
| | Kind | Content Amount [mass %] | Kind | Content Amount [mass %] | Aprotic Solvent Kind | Silicon Compound Kind | Before Surface Treatment | After Surface Treatment |
| Ex. 4-1a | TMS-TFA | 3.7 | HMDS | 4 | PGMEA | — | <10 | ○ (90) |
| Ex. 4-2a | TMS-TFA | 0.9 | HMDS | 6.5 | PGMEA | — | <10 | ○ (88) |
| Ex. 4-3a | TMS-TFA | 0.2 | HMDS | 7 | PGMEA | — | <10 | ○ (86) |
| Ex. 4-4a | BDMS-TFA | 1.1 | DBTMDS | 6 | PGMEA | — | <10 | ○ (90) |
| Ex. 4-5a | ODMS-TFA | 1.4 | DOTMDS | 5.6 | PGMEA | — | <10 | ○ (90) |
| Ex. 4-6a | TMS-TFMSA | 1.1 | HMDS | 6.4 | PGMEA | — | <10 | ○ (90) |
| Comp. Ex. 4-1 | — | — | HMDS | 7 | PGMEA | — | <10 | x (16) |
| Comp. Ex. 4-2a | TMS-TFA | 7.4 | HMDS | 0.005 | PGMEA | — | <10 | x (78) |

* The content amount of the aminosilane compound is based on the total amount of the components (I) to (III).
The content amount of the other component is based on the total amount of the water-repellent protective film-forming liquid chemical.

kinds and content amounts of the aminosilane compound, the silicon compound and the silazane compound. The evaluation of the surface-treated wafers was performed. The results are shown in TABLE 7. As the results of the corresponding comparative example in which no acidic compound was contacted, the results of Comparative Example 3-1 are also shown in the table.

Example 4-1a

The same surface treatment operation as in Example 4-1 was performed except that TFA as the acidic compound was added, in a state of being diluted with (if not compatible, dispersed in) an aprotic solvent PBMEA, to the raw chemical in the above section: "Preparation of Water-Repellent Protective Film-Forming Liquid Chemical and Surface Treatment of Silicon Wafer with Protective Film-Forming Liquid Chemical". The evaluation was performed in the same manner as above. Herein, the addition amount of the TFA was controlled to 0.2 mol per 1 kg of the total amount Examples 4-2a to 4-6a and Comparative Example 4-2a The surface treatment of wafers were performed in the same manner as in Example 4-1a, except for changing the kind and contact amount of the acidic compound and the kinds and content amounts of the aminosilane compound, the silicon compound and the silazane compound. The evaluation of the surface-treated wafers was performed. The results are shown in TABLE 8. As the results of the corresponding comparative example in which no acidic compound was contacted, the results of Comparative Example 4-1 are also shown in the table.

Example 5-1

The same surface treatment operation as in Example 1-2 was performed except that $NH_3$ as the protic compound was added, in a state of being diluted with an aprotic solvent dioxane, to the raw chemical in the above section: "Preparation of Water-Repellent Protective Film-Forming Liquid Chemical". The evaluation was performed in the same manner as above. Herein, the addition amount of the $NH_3$ was controlled to 0.05 mol per 1 kg of the total amount of the TMS-TFA, the HMDS, the PGMEA contained in the raw chemical and the dioxane used for dilution of the protic compound. The results are shown in TABLE 9. The concentration of the NH₃/dioxane solution added to the raw chemical was set to 0.4 mol/liter.

TABLE 9

| | Raw Chemical Composition | | | | Protic Compound (added in diluted form with aprotic solvent) | | | | | Protective Film-Forming Liquid Chemical (I) |
|---|---|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Dilution Conc. [mol/liter] | Dilution Solvent | Aminosilane Compound * Kind |
| Ex. 5-1 | TMS-TFA | HMDS | PGMEA | — | NH₃ | Addition | 0.05 | 0.4 | Dioxane | TMS-NH₂ |
| Ex. 5-2 | TMS-TFA | HMDS | PGMEA | — | NH₃ | Addition | 0.05 | 0.4 | THF | TMS-NH₂ |
| Comp. Ex. 1-1 | TMS-TFA | HMDS | PGMEA | — | — | — | — | — | — | — |

| | Protective Film-Forming Liquid Chemical | | | | | | | | | |
|---|---|---|---|---|---|---|---|---|---|---|
| | (I) Aminosilane Compound * | (II) Silicon Compound | | (IV) Silazane Compound | | (III) | Other | Contact Angle [°] | |
| | Content Amount [mass %] | Kind | Content Amount [mass %] | Kind | Content Amount [mass %] | Aprotic Solvent Kind | Silicon Compound Kind | Before Surface Treatment | After Surface Treatment |
| Ex. 5-1 | 0.12 | TMS-TFA | 1.5 | HMDS | 6.2 | PGMEA Dioxane | — | <10 | ○ (90) |
| Ex. 5-2 | 0.12 | TMS-TFA | 1.5 | HMDS | 6.2 | PGMEA THF | — | <10 | ○ (90) |
| Comp. Ex. 1-1 | — | TMS-TFA | 1.5 | HMDS | 6.5 | PGMEA | — | <10 | × (76) |

* The content amount of the aminosilane compound is based on the total amount of the components (I) to (III).
The content amount of the other component is based on the total amount of the water-repellent protective film-forming liquid chemical.

Example 5-2

The surface treatment of a wafer was performed in the same manner as in Example 5-1 except that the aprotic solvent used for dilution of the protic compound was changed to tetrahydrofuran (THF). The evaluation of the surface-treated wafer was performed. The results are shown in TABLE 9. As the results of the corresponding comparative example in which no protic compound was contacted, the results of Comparative Example 1-1 are also shown in the table.

Example 6-1

The same surface treatment operation as in Example 2-2 was performed except that NH₃ as the protic compound was added, in a state of being diluted with an aprotic solvent dioxane, to the raw chemical in the above section: "Preparation of Water-Repellent Protective Film-Forming Liquid Chemical and Surface Treatment of Silicon Wafer with Protective Film-Forming Liquid Chemical". The evaluation was performed in the same manner as above. Herein, the addition amount of the NH₃ was controlled to 0.05 mol per 1 kg of the total amount of the TMS-TFA, the HMDS, the PGMEA contained in the raw chemical and the dioxane used for dilution of the protic compound. The results are shown in TABLE 10. The concentration of the NH₃/dioxane solution added to the raw chemical was set to 0.4 mol/liter.

TABLE 10

| | Raw Chemical Composition | | | | Protic Compound (added in diluted form with aprotic solvent) | | | | | Protective Film-Forming Liquid Chemical (I) |
|---|---|---|---|---|---|---|---|---|---|---|
| | (II) Silicon Compound Kind | (IV) Silazane Compound Kind | (III) Aprotic Solvent Kind | Other Silicon Compound Kind | Kind | Contact Method | Contact Amount [mol/kg] | Dilution Conc. [mol/liter] | Dilution Solvent | Aminosilane Compound * Kind |
| Ex. 6-1 | TMS-TFA | HMDS | PGMEA | — | NH₃ | Addition | 0.05 | 0.4 | Dioxane | TMS-NH₂ |
| Ex. 6-2 | TMS-TFA | HMDS | PGMEA | — | NH₃ | Addition | 0.05 | 0.4 | THF | TMS-NH₂ |
| Comp. Ex. 2-1 | TMS-TFA | HMDS | PGMEA | — | — | — | — | — | — | — |

TABLE 10-continued

| | Protective Film-Forming Liquid Chemical | | | | | | | | Contact Angle [°] | |
|---|---|---|---|---|---|---|---|---|---|---|
| | (I) Aminosilane Compound * | | (II) Silicon Compound | | (IV) Silazane Compound | | (III) | Other | | |
| | Content Amount [mass %] | Kind | Content Amount [mass %] | Kind | Content Amount [mass %] | Aprotic Solvent Kind | | Silicon Compound Kind | Before Surface Treatment | After Surface Treatment |
| Ex. 6-1 | 0.12 | TMS-TFA | 1.5 | HMDS | 6.2 | PGMEA Dioxane | | — | <10 | o (90) |
| Ex. 6-2 | 0.12 | TMS-TFA | 1.5 | HMDS | 6.2 | PGMEA THF | | — | <10 | o (90) |
| Comp. Ex. 2-1 | — | TMS-TFA | 1.5 | HMDS | 6.5 | PGMEA | | — | <10 | x (76) |

\* The content amount of the aminosilane compound is based on the total amount of the components (I) to (III).
The content amount of the other component is based on the total amount of the water-repellent protective film-forming liquid chemical.

Example 6-2

The surface treatment of a wafer was performed in the same manner as in Example 6-1 except that the aprotic solvent used for dilution of the protic compound was changed to tetrahydrofuran (THF). The evaluation of the surface-treated wafer was performed. The results are shown in TABLE 10. As the results of the corresponding comparative example in which no protic compound was contacted, the results of Comparative Example 2-1 are also shown in the table.

As described above, the adoption of the water-repellent protective film-forming liquid chemical and the wafer surface treatment method according to the present disclosure similarly leads to a further improvement of the water repellency imparting effect as compared to those of conventional ones even in the case where the protic compound or acidic compound added to the raw chemical is in a state of being diluted with (if not compatible, dispersed in) the aprotic solvent.

The invention claimed is:

1. A water-repellent protective film-forming liquid chemical, comprising the following components:
   (I) an aminosilane compound of the following general formula [1];
   (II) a silicon compound of the following general formula [2]; and
   (III) an aprotic solvent,
   wherein the amount of the component (I) contained in the liquid chemical is 0.02 to 0.5 mass % based on the total amount of the components (I) to (III), $$(R^1)_a Si(H)_b (NH_2)_{4-a-b} \quad [1]$$

where $R^1$ is each independently a monovalent organic group having a monovalent hydrocarbon structure of 1 to 18 carbon atoms in which a part or all of hydrogen atoms may be substituted with a fluorine atom; a is an integer of 1 to 3; b is an integer of 0 to 2; and the sum of a and b is 1 to 3, $$(R^2)_c Si(H)_d X_{4-c-d} \quad [2]$$

where $R^2$ is each independently a monovalent organic group having a monovalent hydrocarbon structure of 1 to 18 carbon atoms in which a part or all of hydrogen atoms may be substituted with a fluorine atom; X is at least one group selected from the group consisting of a halogen atom, a —OC(=O)R³ group, a —OS(=O)₂—R³ group, a —N(S(=O)₂—R³)₂ group and a —C(S(=O)₂—R³)₃ group; R³ is a monovalent perfluoroalkyl group of 1 to 6 carbon atoms; c is an integer of 1 to 3; d is an integer of 0 to 2; and the sum of c and d is 1 to 3, and wherein the amount of the component (II) contained in the liquid chemical is 0.05 to 20 mass % based on the total amount of the components (I) to (III).

2. The water-repellent protective film-forming liquid chemical according to claim 1, wherein the component (I) is a compound of the following general formula [3]

$$(R^1)_e Si(H)_f NH_2 \quad [3]$$

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

3. The water-repellent protective film-forming liquid chemical according to claim 1, further comprising: the following component: (IV) a silazane compound of the following general formula [4]

$$[(R^1)_e Si(H)_f]_2 NH \quad [4]$$

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

4. The water-repellent protective film-forming liquid chemical according to claim 1, wherein the component (II) is at least one kind of compound selected from the group consisting of those of the following general formula [5]

$$(R^2)_g Si(OC(=O)R^3)_{4-g} \quad [5]$$

where $R^2$ is each independently a monovalent organic group having a monovalent hydrocarbon structure of 1 to 18 carbon atoms in which a part or all of hydrogen atoms may be substituted with a fluorine atom; $R^3$ is a monovalent perfluoroalkyl group of 1 to 6 carbon atoms; and g is an integer of 1 to 3.

5. The water-repellent protective film-forming liquid chemical according to claim 3, wherein the aprotic solvent comprises an acidic compound of the following general formula [6] in an amount of 0.001 to 0.3 mole relative to 1 kg of the total amount of the components (III) and (IV), $$H-X \quad [6]$$

where X is a halogen atom, a —OC(=O)R³ group, a —OS(=O)₂—R³ group, a —N(S(=O)₂—R³)₂ group or a —C(S(=O)₂—R³)₃ group where R³ is a monovalent perfluoroalkyl group of 1 to 6 carbon atoms.

6. The water-repellent protective film-forming liquid chemical according to claim 1, wherein a number of particles of diameter larger than 0.2 μm is 100 or less per 1 mL.

7. A surface treatment method for a wafer, comprising: a water-repellent protective film-forming step of, in a state that at least one kind of liquid selected from the group consisting of a cleaning liquid and a rinse liquid is retained on a surface of the wafer, replacing the liquid with a water-repellent protective film-forming liquid chemical and retaining the water-repellent protective film-forming liquid chemical on the surface of the wafer; and a drying step, wherein the water-repellent protective film-forming liquid chemical comprises the following components:
(I) an aminosilane compound of the following general formula [1];
(II) a silicon compound of the following general formula [2]; and
(III) an aprotic solvent, and
wherein the amount of the component (I) contained in the liquid chemical is 0.02 to 0.5 mass % based on the total amount of the components (I) to (III), $(R^1)_a Si(H)_b (NH_2)_{4-a-b}$ [1]

where $R^1$ is each independently a monovalent organic group having a monovalent hydrocarbon structure of 1 to 18 carbon atoms in which a part or all of hydrogen atoms may be substituted with a fluorine atom; a is an integer of 1 to 3; b is an integer of 0 to 2; and the sum of a and b is 1 to 3, $(R^2)_c Si(H)_d X_{4-c-d}$ [2]

where $R^2$ is each independently a monovalent organic group having a monovalent hydrocarbon structure of 1 to 18 carbon atoms in which a part or all of hydrogen atoms may be substituted with a fluorine atom; X is at least one group selected from the group consisting of a halogen atom, a —OC(=O)$R^3$ group, a —OS(=O)$_2$—$R^3$ group, a —N(S(=O)$_2$—$R^3$)$_2$ group and a —C(S(=O)$_2$—$R^3$)$_3$ group; $R^3$ is a monovalent perfluoroalkyl group of 1 to 6 carbon atoms; c is an integer of 1 to 3; d is an integer of 0 to 2; and the sum of c and d is 1 to 3, and wherein the amount of the component (II) contained in the liquid chemical is 0.05 to 20 mass % based on the total amount of the components (I) to (III).

8. The surface treatment method for the wafer according to claim 7, wherein the component (I) is a compound of the following general formula [3]

$(R^1)_e Si(H)_f NH_2$ [3]

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

9. The surface treatment method for the wafer according to claim 7, wherein the water-repellent protective film-forming liquid chemical further comprises the following component: (IV) a silazane compound of the following general formula [4]

$[(R^1)_e Si(H)_f]_2 NH$ [4]

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

10. The surface treatment method for the wafer according to claim 7, further comprising, before the water-repellent protective film-forming step, a liquid chemical preparation step of bringing, into contact with a raw chemical containing the following components: (II) the silicon compound of the general formula [2]; (IV) a silazane compound of the following general formula [4]; and (III) the aprotic solvent, a protic compound in an amount of 0.001 to 0.3 mol relative to 1 kg of the total amount of the components (II), (III) and (IV), thereby preparing the water-repellent protective film-forming liquid chemical containing the components (I) to (III) wherein the amount of the component (I) contained in the liquid chemical is 0.02 to 0.5 mass % based on the total amount of the components (I) to (III), $[(R^1)_e Si(H)_f]_2 NH$ [4]

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

11. The surface treatment method for the wafer according to claim 9, further comprising, before the water-repellent protective film-forming step, a liquid chemical preparation step of bringing, into contact with a raw chemical containing the following components: (II) the silicon compound of the general formula [2]; (IV) a silazane compound of the following general formula [4]; and (III) the aprotic solvent, a protic compound in an amount of 0.001 to 0.3 mol relative to 1 kg of the total amount of the components (II), (III) and (IV), thereby preparing the water-repellent protective film-forming liquid chemical containing the components (I) to (IV) wherein the amount of the component (I) contained in the liquid chemical is 0.02 to 0.5 mass % based on the total amount of the components (I) to (III), $[(R^1)_e Si(H)_f]_2 NH$ [4]

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3.

12. The surface treatment method for the wafer according to claim 10, wherein the liquid chemical preparation step is performed by introducing the raw chemical into a space containing the protic compound and thereby bringing the protic compound into contact with the raw chemical.

13. The surface treatment method for the wafer according to claim 10, wherein the protic compound is in gaseous form.

14. The surface treatment method for the wafer according to claim 10, wherein the protic compound is in liquid form.

15. The surface treatment method for the wafer according to claim 10, wherein the protic compound is a compound having a —OH group and/or a —NH$_2$ group.

16. The surface treatment method for the wafer according to claim 10, wherein the protic compound is water and/or 2-propanol.

17. The surface treatment method for the wafer according to claim 7, further comprising, before the water-repellent protective film-forming step, a liquid chemical preparation step of bringing, into contact with a raw chemical containing the following components: (IV) a silazane compound of the following general formula [4]; and (III) the aprotic solvent, an acidic compound of the following general formula [6] in an amount of 0.001 to 0.3 mole relative to 1 kg of the total amount of the components (III) and (IV), thereby preparing the water-repellent protective film-forming liquid chemical containing the components (I) to (III) wherein the amount of the component (I) contained in the liquid chemical is 0.02 to 0.5 mass % based on the total amount of the components (I) to (III), $[(R^1)_e Si(H)_f]_2 NH$ [4]

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3, $$H\text{—}X \quad [6]$$

where X is a halogen atom, a —OC(=O)$R^3$ group, a —OS(=O)$_2$—$R^3$)$_2$ group, a —N(S(=O)$_2$—$R^3$)$_2$ group or a —C(S(=O)$_2$—$R^3$)$_3$ group where $R^3$ is a monovalent perfluoroalkyl group of 1 to 6 carbon atoms.

18. The surface treatment method for the wafer according to claim 9, further comprising, before the water-repellent protective film-forming step, a liquid chemical preparation step of bringing, into contact with a raw chemical containing the following components: (IV) a silazane compound of the following general formula [4]; and (III) the aprotic solvent, an acidic compound of the following general formula [6] in an amount of 0.001 to 0.3 mole relative to 1 kg of the total amount of the components (III) and (IV), thereby preparing the water-repellent protective film-forming liquid chemical containing the components (I) to (IV) wherein the amount of the component (I) contained in the liquid chemical is 0.02 to 0.5 mass % based on the total amount of the components (I) to (III), $$[(R^1)_e Si(H)]_2 NH \quad [4]$$

where $R^1$ is each independently a monovalent organic group having a monovalent hydrocarbon structure of 1 to 18 carbon atoms in which a part or all of hydrogen atoms may be substituted with a fluorine atom; e is an integer of 1 to 3; f is an integer of 0 to 2; and the sum of e and f is 3, $$H\text{—}X \quad [6]$$

where X is a halogen atom, a —OC(=O)$R^3$ group, a —OS(=O)$_2$—$R^3$)$_2$ group, a —N(S(=O)$_2$—$R^3$)$_2$ group or a —C(S(=O)$_2$—$R^3$)$_3$ group; and $R^3$ is a monovalent perfluoroalkyl group of 1 to 6 carbon atoms.

19. The surface treatment method for the wafer according to claim 7, wherein the component (II) is at least one kind of compound selected from those of the following general formula [5]

$$(R^2)_g Si(OC(=O)R^3)_{4-g} \quad [5]$$

where $R^2$ is each independently a monovalent organic group having a monovalent hydrocarbon structure of 1 to 18 carbon atoms in which a part or all of hydrogen atoms may be substituted with a fluorine atom; $R^3$ is a monovalent perfluoroalkyl group of 1 to 6 carbon atoms; and g is an integer of 1 to 3.

20. The surface treatment method for the wafer according to claim 11, wherein the liquid chemical preparation step is performed by introducing the raw chemical into a space containing the protic compound and thereby bringing the protic compound into contact with the raw chemical.

21. The surface treatment method for the wafer according to claim 11, wherein the protic compound is in gaseous form.

22. The surface treatment method for the wafer according to claim 11, wherein the protic compound is in liquid form.

23. The surface treatment method for the wafer according to claim 11, wherein the protic compound is a compound having a —OH group and/or a —NH$_2$ group.

24. The surface treatment method for the wafer according to claim 11, wherein the protic compound is water and/or 2-propanol.

* * * * *